(12) United States Patent
Seo et al.

(10) Patent No.: US 11,450,389 B2
(45) Date of Patent: Sep. 20, 2022

(54) NON-VOLATILE MEMORY DEVICE AND AN OPERATION METHOD THEREOF

(71) Applicant: SAMSUNG ELECTRONICS CO., LTD., Suwon-si (KR)

(72) Inventors: Jun-Ho Seo, Hwaseong-si (KR); Jung Ho Lee, Seongnam-si (KR); Dae Sik Ham, Suwon-si (KR); Gi Baek Kim, Seongnam-si (KR); Sang Yong Yoon, Seoul (KR); Won-Taeck Jung, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/195,824

(22) Filed: Mar. 9, 2021

(65) Prior Publication Data
US 2022/0020438 A1    Jan. 20, 2022

(30) Foreign Application Priority Data
Jul. 17, 2020 (KR) .......................... 10-2020-0088811

(51) Int. Cl.
| G11C 16/10 | (2006.01) |
| G11C 16/30 | (2006.01) |
| G11C 16/08 | (2006.01) |
| G11C 16/04 | (2006.01) |
| G11C 16/26 | (2006.01) |

(52) U.S. Cl.
CPC .......... *G11C 16/30* (2013.01); *G11C 16/0433* (2013.01); *G11C 16/08* (2013.01); *G11C 16/10* (2013.01); *G11C 16/26* (2013.01)

(58) Field of Classification Search
CPC ........................................................ G11C 7/14
USPC ......................................................... 365/210.1
See application file for complete search history.

(56) References Cited

U.S. PATENT DOCUMENTS

| 7,349,258 B2 | 3/2008 | Fong et al. |
| 7,495,956 B2 | 2/2009 | Fong et al. |
| 7,787,306 B2 | 8/2010 | Park et al. |
| 7,804,718 B2 | 9/2010 | Kim |

(Continued)

FOREIGN PATENT DOCUMENTS

KR    10-2018-0021964    3/2018

OTHER PUBLICATIONS

Indian Office Action dated Jul. 8, 2022 issued in corresponding Indian Patent Application No. 202144029891.

*Primary Examiner* — Jason Lappas
(74) *Attorney, Agent, or Firm* — F. Chau & Associates, LLC

(57) ABSTRACT

A non-volatile memory device including: a first string including a first string select transistor, a first memory cell and a first ground select transistor, a second string including a second string select transistor, a second memory cell and a second ground select transistor, and a controller to apply a pass voltage to a first string select line from a first time, apply a first read voltage to a first word line during a first read section from the first time to a second time, apply a first ground select line voltage to a first ground select line from the first time, apply a ground voltage to a second string select line, apply the first ground select line voltage to a second ground select line during a first control section, and apply a first common source line voltage to a common source line during the first control section.

20 Claims, 21 Drawing Sheets

(56) References Cited

U.S. PATENT DOCUMENTS

| | | | |
|---|---|---|---|
| 8,085,595 B2 | 12/2011 | Kim et al. | |
| 8,085,601 B2 | 12/2011 | Kim | |
| 8,638,608 B2 | 1/2014 | Lai et al. | |
| 9,286,994 B1 | 3/2016 | Chen et al. | |
| 9,293,208 B2 | 3/2016 | Yoo et al. | |
| 9,336,892 B1 | 5/2016 | Chen et al. | |
| 9,418,749 B2 | 8/2016 | Nam et al. | |
| 9,496,038 B1 | 11/2016 | Kwak et al. | |
| 9,928,902 B2 | 3/2018 | Kwon et al. | |
| 10,008,269 B2 | 6/2018 | Maejima | |
| 10,607,688 B2 | 3/2020 | Shin et al. | |
| 2011/0199829 A1 | 8/2011 | Lee et al. | |
| 2013/0163345 A1 | 6/2013 | Ahn et al. | |
| 2019/0171381 A1* | 6/2019 | Ioannou | G06F 3/0679 |
| 2019/0267092 A1 | 8/2019 | Joe et al. | |

* cited by examiner

NON-VOLATILE MEMORY DEVICE AND AN OPERATION METHOD THEREOF

CROSS-REFERENCE TO RELATED APPLICATION

This application claims priority under 35 U.S.C. § 119 to Korean Patent Application No. 10-2020-0088811, filed on Jul. 17, 2020, the disclosure of which is incorporated by reference herein in its entirety.

1. TECHNICAL FIELD

The present inventive concept relates to a non-volatile memory device and an operation method thereof.

2. DISCUSSION OF THE RELATED ART

A semiconductor memory device is used for data storage. The semiconductor memory device may be implemented using semiconductors such as silicon (Si), germanium (Ge), gallium arsenide (GaAs), and indium phosphide (InP). The semiconductor memory device may be one of a volatile memory device and a non-volatile memory device.

The volatile memory device is a memory device that requires power to maintain stored data and thus when its power supply is cut off, the data is lost. The volatile memory device may include a Static Random Access Memory (SRAM), a Dynamic RAM (DRAM), a Synchronous DRAM (SDRAM) and the like. The non-volatile memory device is a memory device that can retain stored data even when its power supply is cut off. The non-volatile memory device includes a Read Only Memory (ROM), a Programmable ROM (PROM), an Electrically Programmable ROM (EPROM), an Electrically Erasable and Programmable ROM (EEPROM), a flash memory device, a Phase-change RAM (PRAM), a Magnetic RAM (MRAM), a Resistive RAM (RRAM), a Ferroelectric RAM (FRAM) and the like. The flash memory device may be classified as a NOR type or a NAND type.

A semiconductor memory device having a three-dimensional structure may have an increased degree of integration compared to a two-dimensional semiconductor memory device. Due to the structural difference between the three-dimensional semiconductor memory device and the two-dimensional semiconductor memory device, different driving methods may be employed.

SUMMARY

According to an exemplary embodiment of the present inventive concept, there is provided a non-volatile memory device including: a memory cell array which includes a first string including a first string select transistor, a first memory cell and a first ground select transistor stacked sequentially in a first direction, a second string including a second string select transistor, a second memory cell and a second ground select transistor stacked sequentially in the first direction, and a common source line, wherein a first word line is connected to the first memory cell, a first string select line is connected to the first string select transistor, a first ground select line is connected to the first ground select transistor, a second word line is connected to the second memory cell, a second string select line is connected to the second string select transistor, and a second ground select line is connected to the second ground select transistor; and a controller configured to apply a pass voltage to the first string select line from a first time point, apply a first read voltage to the first word line during a first read section from the first time point to a second time point, apply a first ground select line voltage to the first ground select line from the first time point, apply a ground voltage to the second string select line, apply the first ground select line voltage to the second ground select line during a first control section which is a portion of the first read section, and apply a first common source line voltage to the common source line during the first control section.

According to an exemplary embodiment of the present inventive concept, there is provided a non-volatile memory system including: a host; and a non-volatile memory device which receives a read command from the host, wherein the non-volatile memory device includes a memory cell array which includes a first string including a first string select transistor, a first memory cell and a first ground select transistor, a second string including a second memory cell corresponding to a read address of the read command, and a common source line; and a controller which applies a first read voltage to the second memory cell during a first read section, applies a first ground select line voltage to the first ground select transistor during a first control section, which is a pan of the first read section, and applies a first common source line voltage to the common source line during the first control section.

According to an exemplary embodiment of the present inventive concept, there is provided a non-volatile memory device including: a memory cell array which includes a first string including a first string select transistor, a first memory cell and a first ground select transistor, a second string including a second string select transistor, a second memory cell and a second ground select transistor, and a common source line connected to the first string and the second string; an address decoder connected to the first memory cell through a first word line, connected to the first string select transistor through a first string select line, connected to the first ground select transistor through a first ground select line, connected to the second memory cell through a second word line, connected to the second string select transistor through a second string select line, connected to the second ground select transistor through a second ground select line, and connected to the common source line; an input/output circuit which receives a decoded column address from the address decoder; and a controller which applies a pass voltage to the first string select line from a first time point, applies a first read voltage to the first word line during a first read section from the first time point to a second time point, applies a first ground select line voltage to the first ground select line from the first time point, applies a ground voltage to the second string select line, applies a first ground select line voltage to the second ground select line during a first control section, which is a portion of the first read section, and applies a first common source line voltage to the common source line during the first control section.

According to an exemplary embodiment of the present inventive concept, there is provided a method of operating a controller which drives a non-volatile memory device which includes a first string including a first string select transistor, a first memory cell and a first ground select transistor stacked sequentially in a first direction, a second string including a second string select transistor, a second memory cell and a second ground select transistor stacked sequentially in the first direction, and a common source line, the method including: applying a pass voltage to the first string select transistor from a first time point; applying a first read voltage to the first memory cell during a first read section from the first time point to a second time point; applying a first ground select line voltage to the first ground select transistor from the first time point; applying a ground voltage to the second string select transistor; applying the first ground select line voltage to the second ground select line during a first control section which is a portion of the first read section; and applying a first common source line voltage to the common source line during the first control section.

According to an exemplary embodiment of the present inventive concept, there is provided a non-volatile memory device including: a memory cell array which includes a first string select transistor, a first memory cell, a first ground select transistor, a second string select transistor, a second memory cell, a second ground select transistor, and a common source line, wherein a first word line is connected to the first memory cell, a first string select line is connected to the first string select transistor, a first ground select line is connected to the first ground select transistor, a second word line is connected to the second memory cell, a second string select line is connected to the second string select transistor, and a second ground select line is connected to the second ground select transistor; and a controller configured to: apply a pass voltage to the first string select line from a first time point, apply a first read voltage to the first word line during a first read section from the first time point to a second time point, apply a first ground select line voltage to the first ground select line from the first time point, apply a ground voltage to the second string select line, apply the first ground select line voltage to the second ground select line during a first control section which is a portion of the first read section, apply a first common source line voltage to the common source line during the first control section, apply a second ground select line voltage to the second ground select line during a second control section which is a portion of a second read section, and apply a second common source line voltage to the common source line during the second control section.

DETAILED DESCRIPTION OF THE EMBODIMENTS

Figure 1:
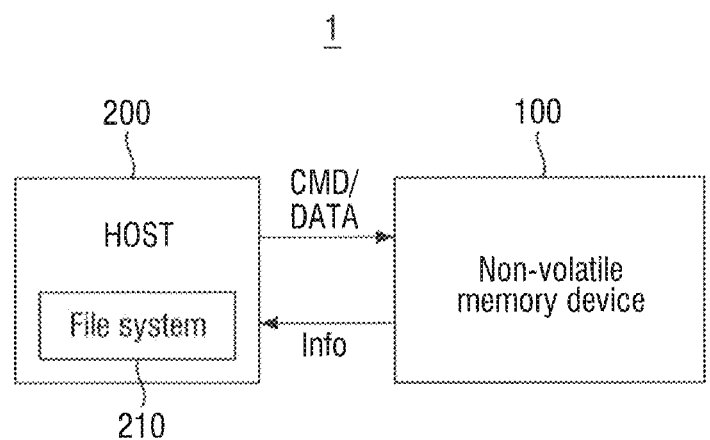
FIG. 1 is a block diagram showing a non-volatile memory system according to some embodiments of the present inventive concept.

FIG. 1 is a block diagram showing a non-volatile memory system according to some embodiments of the present inventive concept.

Referring to FIG. 1, the non-volatile memory system according to some embodiments of the present inventive concept includes a non-volatile memory device (e.g., a storage device, 100) and a host 200 outside the non-volatile memory device 100. Each configuration described hereinafter may be made up of separate chips, modules or devices, and may be included inside a single device. For example, the non-volatile memory device 100 may also be used by being connected to a separate host 200. However, the present inventive concept is not limited thereto, and the non-volatile memory device 100 and the host 200 may be integrated in a single device.

The host 200 may be driven by executing an operating system (OS). The operating system may include a file system 210 for file management, and a device driver for controlling a peripheral including a data storage device at an operating system level.

The file system 210 may manage file name, extension, file attributes, file size, cluster information, and the like of the files accessed at the request of the host 200. In addition, file-based data may be generated, deleted, and managed by the file system 210. The device driver may be a software module, e.g., a Kernel module, for controlling the data storage device. The host 200 may request a write operation and a read operation on the non-volatile memory device 100 through the device driver. In addition, the host 200 may execute a video application, a game application, a Web browser application, and the like to provide various services.

The host 200 may be, for example, an arbitrary electronic device, such as a personal computer (PC), a laptop, a mobile phone, a smart phone, a tablet PC, an MP3 player, a personal digital assistant (PDA), an enterprise digital assistant (EDA), a portable multimedia player (PMP), a digital camera, a music player, a portable game console, a navigation device, a wearable device, an internet of things (IoT) device, an internet of everything (IoE) device, an e-book, a virtual reality (VR) device, and an augmented reality (AR) device.

The host 200 may perform a read operation on a specific address in the non-volatile memory device 100 through a command (CMD) to the non-volatile memory device 100. In addition, the host 200 may program data (DATA) at a specific address in the non-volatile memory device 100 through the command (CMD) to the non-volatile memory device 100.

The non-volatile memory device 100 may transmit information (Info) stored at a specific address to the host 200 after receiving the read command from the host 200. In addition, the non-volatile memory device 100 may program data (DATA) at a specific address after receiving a program command from the host 200.

The non-volatile memory device 100 according to some embodiments of the present inventive concept may be configured, but is not limited to, a solid state drive (SSD), a memory card, an embedded Multi Media Card (eMMC), or a Universal Flash Storage (UFS).

Hereinafter, the non-volatile memory device 100 according to some embodiments of the present inventive concept will be described with reference to FIG. 2.

Figure 2:
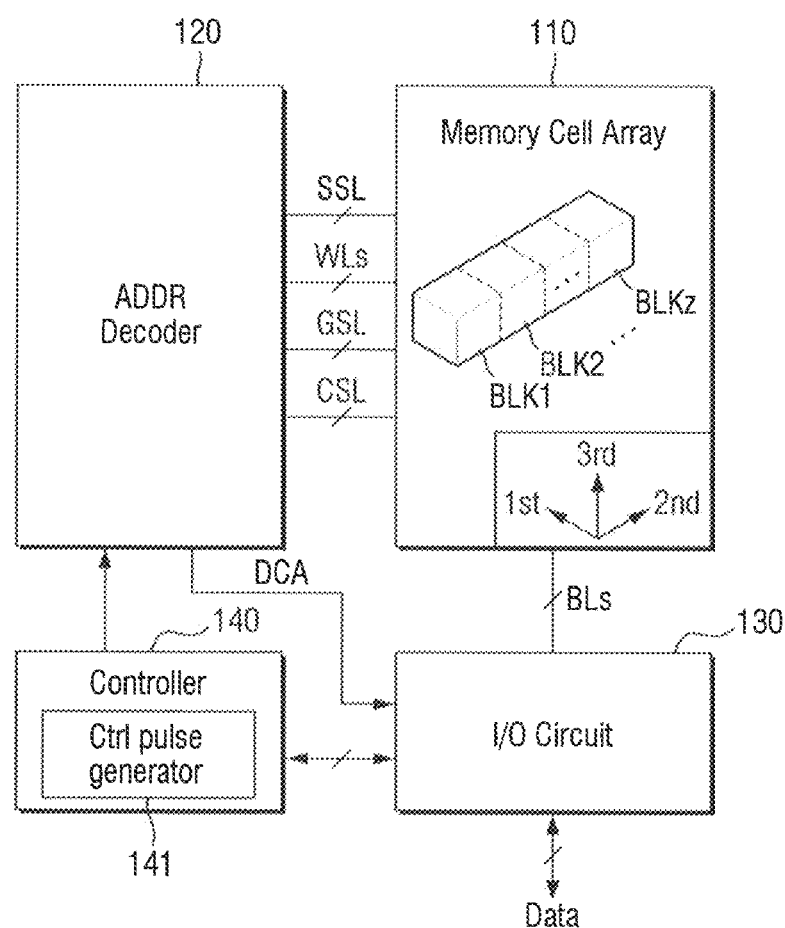
FIG. 2 is a block diagram showing a non-volatile memory device according to some embodiments of the present inventive concept.

FIG. 2 is a block diagram showing a non-volatile memory device according to some embodiments of the present inventive concept.

Referring to FIG. 2, the non-volatile memory device 100 includes a memory cell array 110, an address decoder 120, an I/O circuit 130, and a controller 140.

The memory cell array 110 may be connected to the address decoder 120 through word lines WLs, at least one string select line SSL, a common source line CSL, and at least one ground select line GSL. Further, the memory cell array 110 may be connected to an I/O circuit 130 through the bit lines BLs. The memory cell array 110 includes a plurality of memory blocks BLKz to BLK1.

Each of the plurality of memory blocks BLKz to BLK1 may be arranged on the substrate along a first direction and a second direction different from the first direction. In addition, each of the plurality of memory blocks BLKz to BLK1 includes a plurality of strings having a three-dimensional structure arranged in a third direction different from the first direction and the second direction. Here, each of the plurality of strings may include at least one string select transistor, a plurality of memory cells and at least one ground select transistor in a direction perpendicular to the substrate. Here, each of the plurality of memory cells may store at least one bit. For example, the memory cells may be single level cells, multi-level cells, triple level cells, quad-level cells, etc.

The address decoder 120 may be connected to the memory cell array 110 through the word lines WLs, at least one string select line SSL and at least one ground select line GSL. The address decoder 120 may select the word lines WLs, the string select line SSL, and the ground select line GSL, using a decoded row address. Further, the address decoder 120 may decode a column address among input addresses. Here, the decoded column address DCA may be transmitted to the I/O circuit 130. In some embodiments of the present inventive concept, the address decoder 120 may include a row decoder, a column decoder, an address buffer, and the like, and may be collectively referred to as a peripheral circuit of the memory cell array 110.

The I/O circuit 130 may be connected to the memory cell array 110 through the bit lines BLs. The I/O circuit 130 may receive the decoded column address DCA from the address decoder 120. The I/O circuit 130 may select bit lines BLs, using the decoded column address DCA.

The I/O circuit 130 receives data from the outside (e.g., a memory controller), and stores the input data in the memory cell array 110. Further, the I/O circuit 130 may read data from the memory cell array 110 and output the read data to the outside. In addition, the I/O circuit 130 may read data from a first region of the memory cell array 110, and may store the read data in a second region of the memory cell array 110. For example, the I/O circuit 130 may perform a copy-back operation.

The controller 140 may control overall operations (e.g., program/read/erase, etc.) of the non-volatile memory device 100. The controller 140 may operate in response to control signals or commands that are input from the outside.

The controller 140 according to some embodiments of the present inventive concept includes a control pulse generator 141 that generates control pulses. Since boosting charges of a non-selected string induces a hot carrier injection (HC), a read disturbance may occur at the time of read and verification operations. Therefore, the control pulse generator 141 may apply a predetermined control pulse level for a predetermined period of time to the common source line CSL and/or the ground select line GSL during a state-read section or a verification section, to remove the boosting charges of the non-selected string at the time of the read or verification operation.

Figure 3:
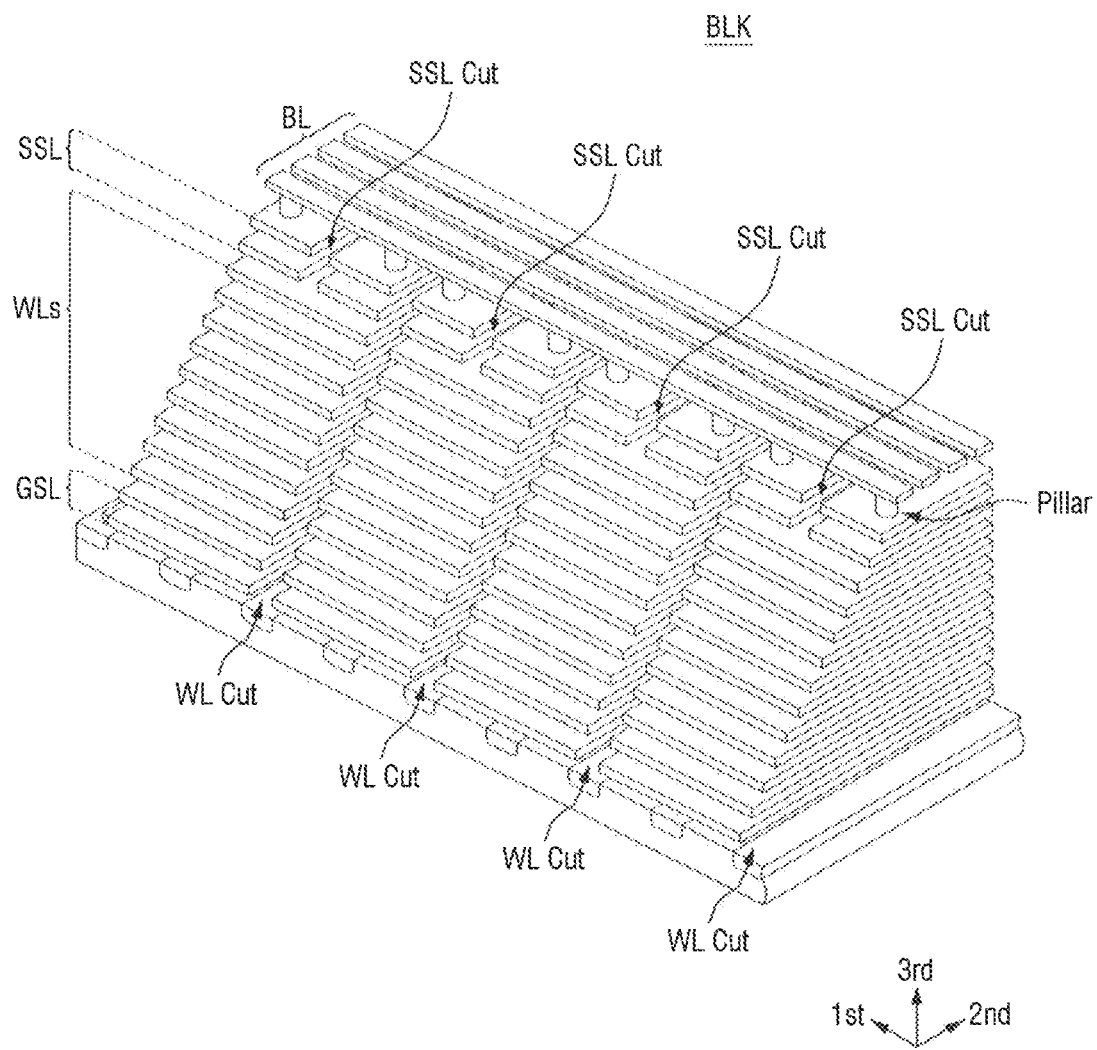
FIG. 3 is a block diagram showing blocks of a non-volatile memory device according to some embodiments of the present inventive concept.

FIG. 3 is a block diagram showing blocks of a non-volatile memory device according to some embodiments of the present inventive concept.

Referring to FIG. 3, the memory block of FIG. 2 (any one of BLK1 to BLKz) is shown as an example. Four sub-blocks may be formed on the substrate of the memory block BLK. Each sub-block may be formed, by stacking at least one ground select line GSL, a plurality of word lines WLs, and at least one string select line SSL between the word line cuts (WL Cut) formed on the substrate, in a plate shape. Here, at least one string select line SSL may be separated by a string select line cut (SSL Cut). Each word line cut (WL Cut) may include a common source line CSL. In some embodiments of the present inventive concept, the common source lines CSL included in each word line cut may be connected in common. A pillar connected to a bit line BL may penetrate at least one ground select line GSL, a plurality of word lines WLs, and at least one string select line SSL, thereby forming the strings.

Subsequently, referring to FIG. 3, although an object between the word line cuts (WL Cut) is shown as a sub-block, the present inventive concept is not limited thereto. For example, the sub-block according to an exemplary embodiment of the present inventive concept may also be an object between the word line cut (WL Cut) and the string select line cut (SSL Cut). The block BLK according to some embodiments of the present inventive concept may be implemented as a structure in which two word lines WLs are merged into one, in other words, as a merged word line structure.

Figure 4:
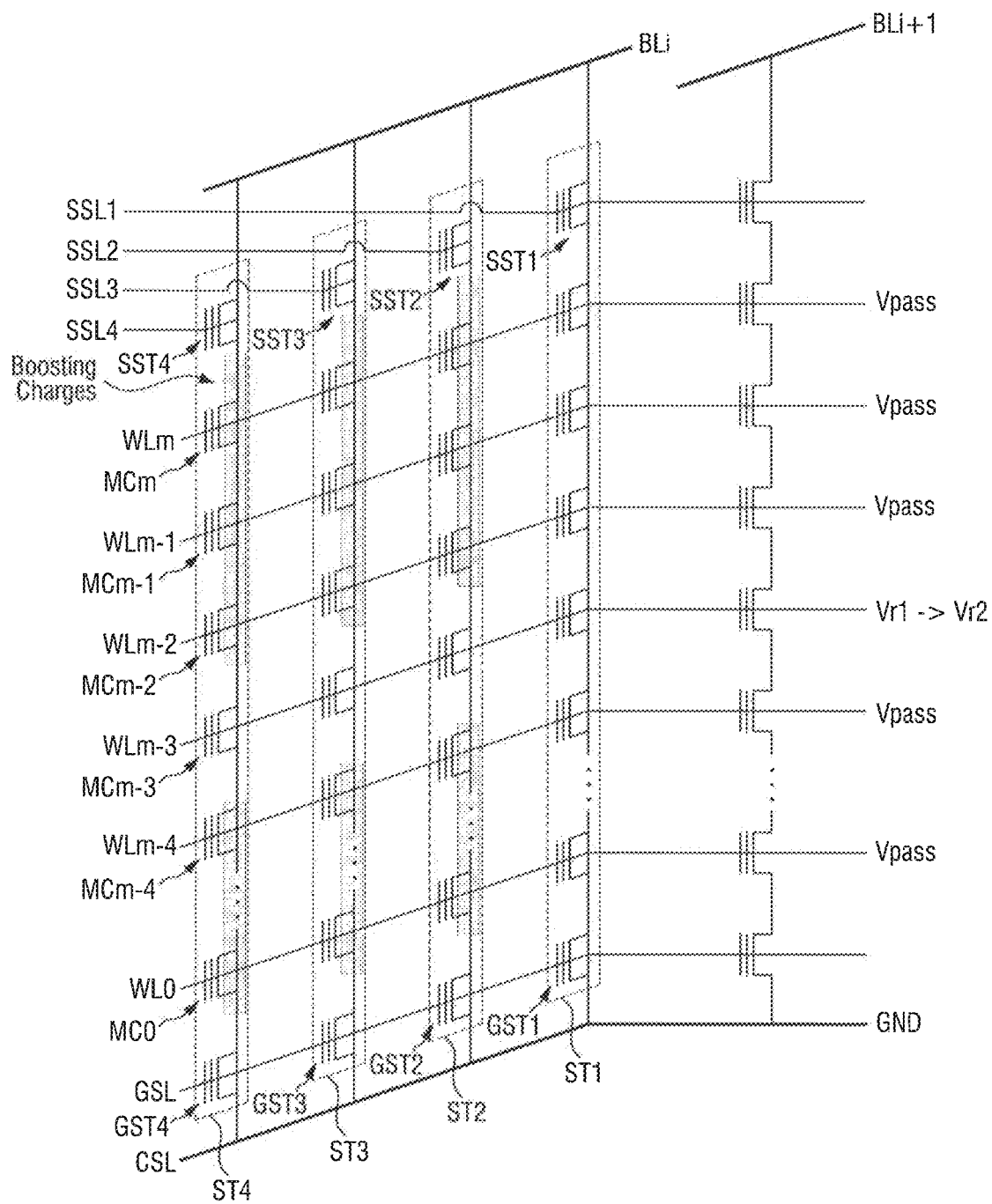
FIG. 4 is a circuit diagram for explaining a read operation of the non-volatile memory device according to some embodiments of the present inventive concept.

FIG. 4 is a circuit diagram for explaining a read operation of the non-volatile memory device according to some embodiments of the present inventive concept.

Referring to FIGS. 2 and 4, an operation of removing the boosting charges through the control pulse at the time of the read operation in the non-volatile memory device 100 according to some embodiments of the present inventive concept will be described as an example.

Hereinafter, for convenience of explanation, it is assumed that the non-volatile memory device 100 according to some embodiments of the present inventive concept performs the read operation on the memory cell corresponding to a word line WLm-3 and a string select line SSL1. For convenience of explanation, it is assumed that four strings ST1, ST2, ST3, and ST4 are connected to one bit line BLi as shown in FIG. 4. In addition, it is assumed that the string ST1 is a selected string and the remaining strings ST2, ST3, and ST4 are non-selected strings. Before performing the detection operation, the boosting charges (shaded portions in FIG. 4) of the non-selected strings ST2, ST3, and ST4 may be removed in a direction of the common source line CSL.

Boosting charges (shaded portions) may be formed in the non-selected strings ST2, ST3, and ST4 due to phenomena such as hot carrier injection (HCI). A process of forming the boosting charges (e.g., shaded portions) in the non-selected string ST4 will be described referring to FIG. 5.

Figure 5:
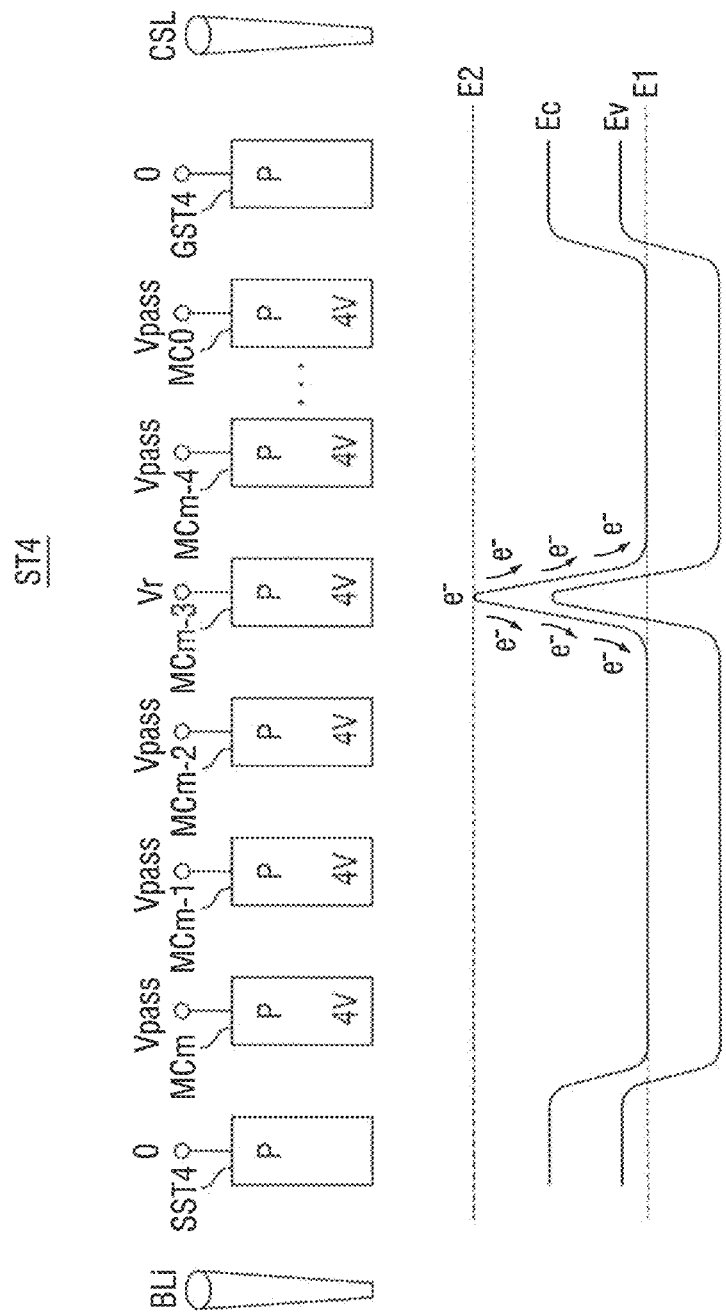
FIG. 5 is a diagram for explaining a hot carrier injection phenomenon that may occur in the non-volatile memory device of FIG. 4.

FIG. 5 is a diagram for explaining the hot carrier injection phenomenon that may occur in the non-volatile memory device of FIG. 4.

Referring to FIGS. 4 and 5, it is assumed that a plurality of memory cells MCm to MC0 is in a programmed state. In addition, it is assumed that the plurality of memory cells MCm to MC0 is programmed and has a threshold voltage of 4V.

To read the data stored in the memory cell MCm-3, a read voltage Vr may be applied to the memory cell MCm-3. The read voltage Vr may be, for example, but is not limited to, 2 V. A read pass voltage Vpass may be applied to memory cells MCm to MCm-2, MCm-4, and MC0 other than the memory cell MCm-3. The read pass voltage Vread may be, for example, but is not limited to, 6V.

Looking at the energy formed in a plurality of memory cells MCm to MC0 through an energy venn diagram, the read pass voltage Vpass higher than the threshold voltage of 4V is applied to the memory cells MCm to MCm-2, MCm-4, and MC0. In addition, a conduction band Ec and a valance band Ev of the energy venn diagram may be lower than energy formed on the string select transistor SST4 and the ground select transistor GST4.

For reference, an interval between the conduction band Ec and the valance band Ev may have an interval of 1.12 eV, in the case when a substrate formed with the plurality of memory cells MCm to MC0, a string select transistor SST4, and a ground select transistor GST4 is silicon.

At this time, the read voltage Vr applied to the memory cell MCm-3 may be lower than the threshold voltage formed on the memory cell MCm-3. In other words, the energy band formed on the memory cell MCm-3 may be higher than the energy band formed on the memory cells MCm to MCm-2, MCm-4, and MC0. In other words, the electrons located at the memory cell MCm-3 are located on the conduction band Ec at the energy level E2, and may have a very high potential energy. Electrons of the memory cell MCm-3 having very high potential energy may move from the energy level E2 to the memory cells MCm to MCm-2, MCm-4 and MC0 in which a relatively low energy level E1 is formed. In other words, electrons having high potential energy at the energy level E2 may become hot carriers or boosting charges having very high kinetic energy, while moving to the memory cells MCm to MCm-2, MCm-4, and MC0 on which a relatively low energy level E1 is formed. The boosting charges that have moved to the memory cells MCm to MCm-2, MCm-4, and MC0 may enter floating gates of the memory cells MCm to MCm-2, MCm-4, and MC0 with high kinetic energy, thereby deteriorating the characteristics of the memory cells MCm to MCm-2, MCm-4, and MC0.

Referring to FIGS. 2 and 4 again, a removal operation of the boosting charges (shaded portions) in the direction of the common source line CSL may be performed through a control pulse generated through the control pulse generator 141. When the control pulse is applied to the ground select line GSL and/or the common source line CSL during the control section, which is at least a partial section of the read section, the ground select transistors GST2, GST3, and GST4 are turned on for a predetermined time, and a passage through which the boosting charges may escape is formed in the common source line CSL, thereby removing and the boosting charges. In other words, the boosting charges may be discharged.

Through FIG. 6 below, the operation of removing the boosting charges through the non-volatile memory device 100 according to some embodiments of the present inventive concept will be explained through a timing diagram.

Figure 6:
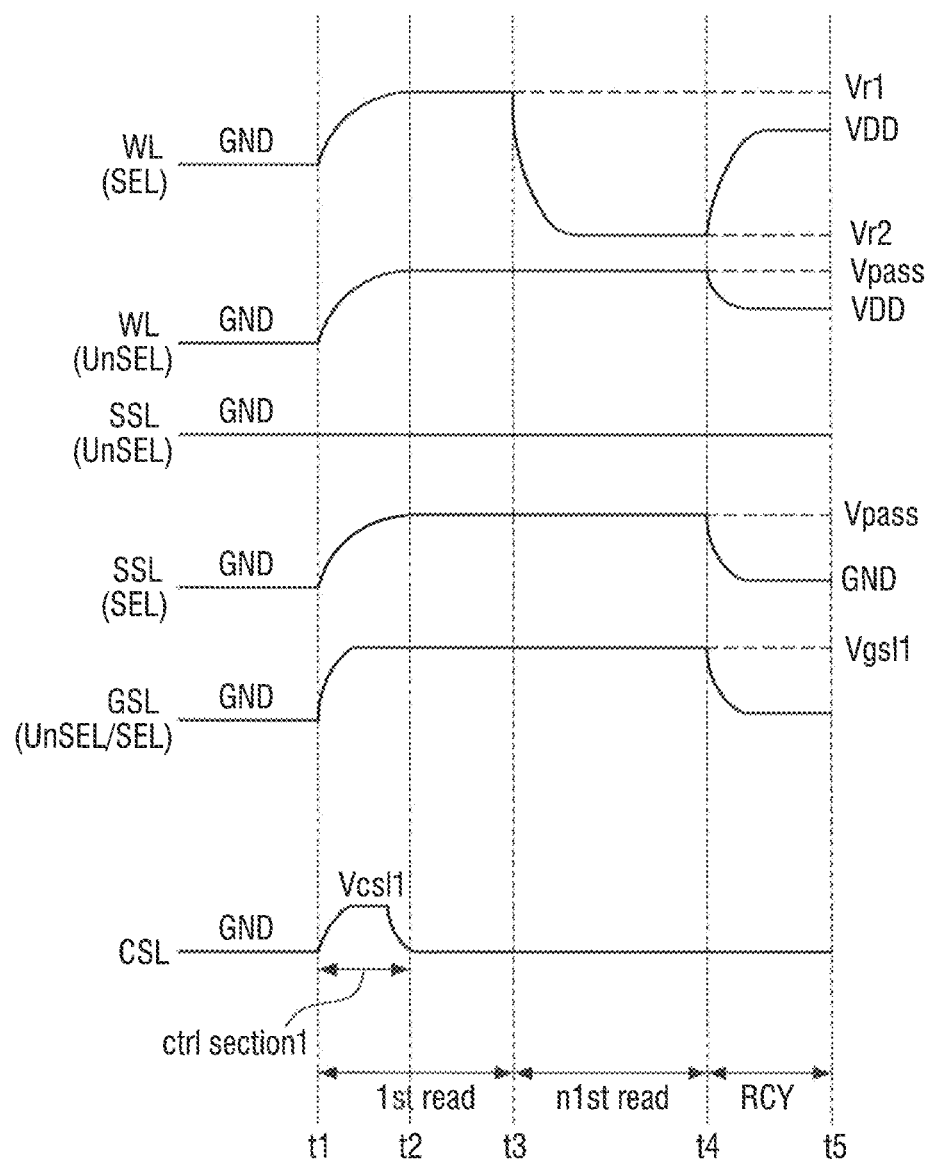
FIG. 6 is a timing diagram for explaining the operation method of the controller in the non-volatile memory device of FIG. 4 according to some embodiments of the present inventive concept.

FIG. 6 is a timing diagram for explaining the operation method of the controller in the non-volatile memory device of FIG. 4 according to some embodiments of the present inventive concept.

Referring to FIGS. 2, 4 and 6, voltages applied to a read operation target word line WL (SEL), a read operation target string select line SSL (SEL), a read operation target ground select line GSL (SEL), a non-read operation target word line WL (UnSEL), a non-read operation target string select line SSL (UnSEL), a non-read operation target ground select line GSL (UnSEL), and the common source line CSL will be explained by a timing diagram.

Hereinafter, it is assumed that each of the memory cells connected to a plurality of word lines WL0 to WLm is a multi-level cell (MLC) that stores 2 bits. However, the following explanation is also applicable to a single level cell (SLC), a triple level cell (TLC), and a quad level cell (QLC).

Here, it is assumed that the read operation target word line WL (SEL) is a selected word line WLm-3, the non-read operation target word line WL (UnSEL) is non-selected word lines WLm to WLm-2, WLm-4, and WL0, the read operation target string select line SSL (SEL) is a selected string select line SSL1, the non-read operation target string select line SSL (UnSEL) is non-selected string select lines SSL2, SSL3 and SSL4, and both the read operation target ground select line GSL (SEL) and the non-read operation target ground select line GSL (UnSEL) are a ground select line GSL.

To perform the read operation on the memory cell MCm-3 of the string ST1, the non-volatile memory device 100 according to some embodiments of the present inventive concept, for example, the controller 140 of the non-volatile memory device 100 according to some embodiments of the present inventive concept, applies a first read voltage Vr1 to the selected word line WLm-3 during a first read section (1st read) from a first time point t1 to a third time point t3, thereby performing the read operation on Least Significant Bit (LSB) data.

After that, to perform the read operation on Most Significant Bit (MSB) data, the controller 140 may apply a second read voltage Vr2 to the selected word line WLm-3 during a second read section (n1st read) from a third time point t3 to a fourth time point t4. The second read section (n1st read) may be, for example, a section at which the read operation on Central Significant Bit (CSB) data and MSB data is performed when the read operation target memory cell is TLC.

After that, the controller 140 may apply a recovery voltage VDD to the selected word line WLm-3 to perform the recovery operation during a recovery section RCY from a fourth time point t4 to a fifth time point t5. The recovery voltage VDD may be an absolute value smaller than absolute values of the first read voltage Vr1 and the second read voltage Vr2.

The non-volatile memory device 100, for example, the controller 140 of the non-volatile memory device 100 may apply a read pass voltage Vpass to the non-selected word lines WLm to WLm-2, WLm-4, and WL0 during the first read section (1st read) and the second read section (n1st) to perform the read operation on the memory cell MCm-3 of the string ST1. The read pass voltage Vpass may have an absolute value greater than the absolute values of the first read voltage Vr1 and the second read voltage Vr2.

After that, the controller 140 may apply the recovery voltage VDD to the non-selected word lines WLm to WLm-2, WLm-4, and WL0 during the recovery section RCY. The recovery voltage VDD may be a value smaller than the read pass voltage Vpass.

The non-volatile memory device 100, for example, the controller 140 of the non-volatile memory device 100 applies a ground voltage GND to the non-selected string select lines SSL2, SSL3 and SSL4 during the first read section (1st read), the second read section (n1st read), and the recovery section RCY to perform the read operation on the memory cell MCm-3 of the string ST1.

The non-volatile memory device 100, for example, the controller 140 of the non-volatile memory device 100 applies the read pass voltage Vpass to the selected string select line SSL1 during the first read section (1st read) and the second read section (n1st read) to perform the read operation on the memory cell MCm-3 of the string ST1.

After that, the controller 140 may apply the ground voltage GND to the selected string select line SSL1 during the recovery section RCY.

The non-volatile memory device 100, for example, the controller 140 of the non-volatile memory device 100 applies a first ground select line voltage Vgsl1 to the ground select line GSL during the first read section (1st read) and the second read section (n1st read) to perform the read operation on the memory cell MCm-3 of the string ST1. The first ground select line voltage Vgsl1 may have, for example, a voltage of 2.5 V or higher.

After that, the controller 140 applies the ground voltage GND to the ground select line GSL during the recovery section RCY.

The non-volatile memory device 100, for example, the controller 140 of the non-volatile memory device 100 applies a first common source line voltage Vcsl1 during the first control section (ctrl section1) through the control pulse generator 141 to remove the boosting charges when performing the read operation on the memory cell Mcm-3 of the string ST1. The first common source line voltage Vcsl1 may have, for example, a voltage of 0 V or more and less than 2 V.

The first control section (ctrl section1), at which the control pulse (for example, the first common source line voltage Vcsl1) is applied, is applied at the first time point t1 at which the first read voltage Vr1 is applied to the selected word line WLm-3. The first time point t1 may be, for example, a time point at which the first read voltage Vr1 is applied to the selected word line WLm-3, to perform the read operation on LSB data when the read operation target memory cell is TLC. In another example, the first time point t1 may be a time point at which the first read voltage Vr1 is applied to the selected word line WLm-3 to perform the read operation on LSB data when the read operation target memory cell is QLC. A length of the first control section (ctrl section1) may be shorter or longer than the length shown in FIG. 6 as long as it is smaller than or equal to the length of the first read section (1st read).

The non-volatile memory device 100, for example, the controller 140 of the non-volatile memory device 100 applies the first common source line voltage Vcsl1 during the first control section (ctrl section1) through the control pulse generator 141 when performing the read operation on the memory cell MCm-3 of the string ST1. Thus, it is possible to prevent generation of hot carriers in the non-volatile memory device 100, and thus, the boosting charges can be removed as well.

Hereinafter, an operation of embodiments in which a connection structure of the common source line CSL is connected in a form different from that shown in FIG. 4 will be described with reference to FIGS. 7 to 10. In the following description, for the sake of simplification of explanation, a repeated explanation of the aforementioned contents may not be provided, and differences will be mainly described.

Figure 7:
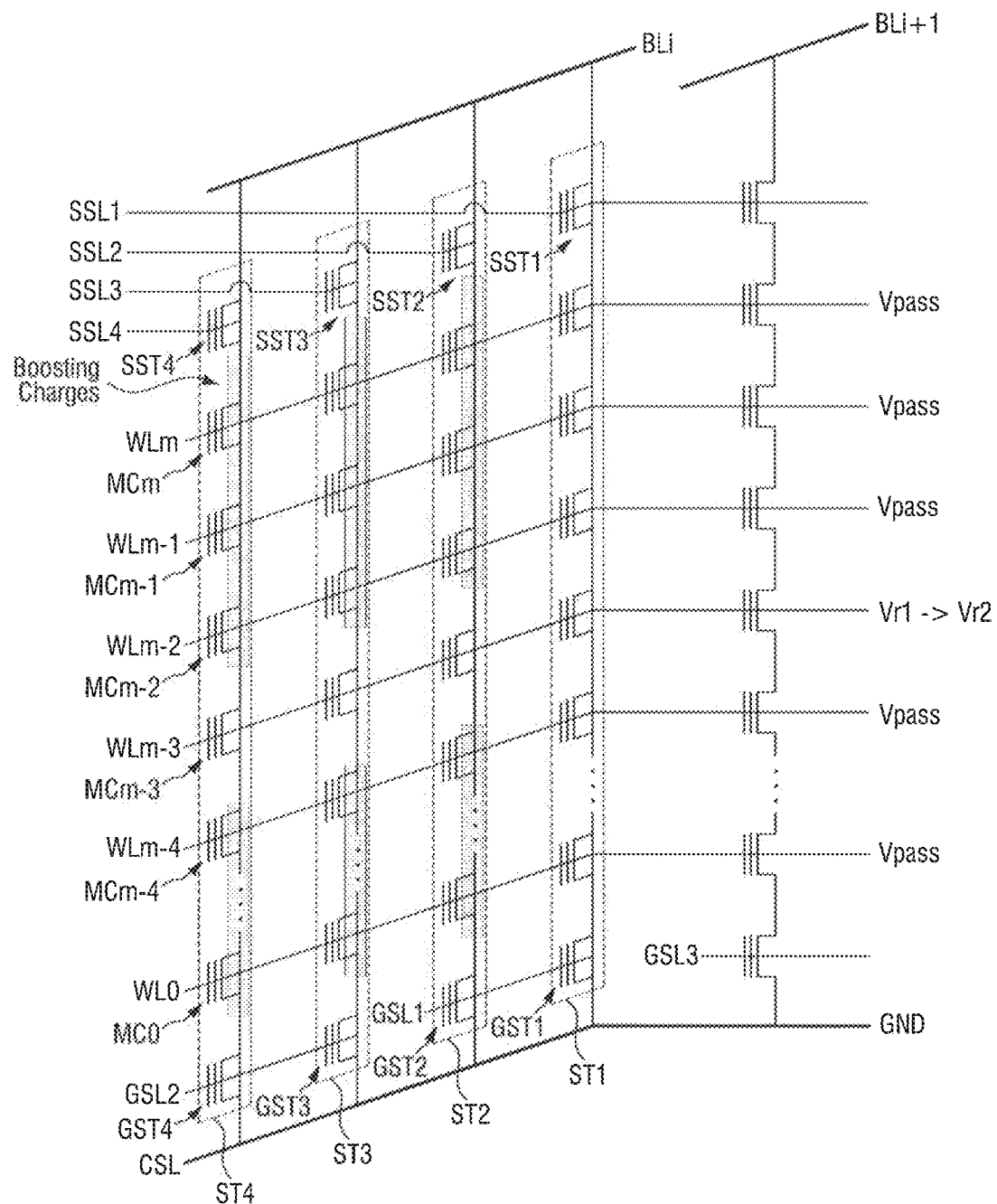
FIG. 7 is a circuit diagram for explaining the read operation of another non-volatile memory device according to some embodiments of the present inventive concept.

FIG. 7 is a circuit diagram for explaining the read operation of another non-volatile memory device according to some embodiments of the present inventive concept.

Referring to FIG. 7, unlike the non-volatile memory device of FIG. 4, a string ST1 selected for the read operation and a non-selected string ST2 in which no read operation is performed are connected to each other through a first ground select line GSL1. In addition, non-selected strings ST3 and ST4 in which no read operation is performed are connected to each other through a second ground select line GSL2. A third ground select line GSL3 is connected to a string connected to bit line BLi+1.

Figure 8:
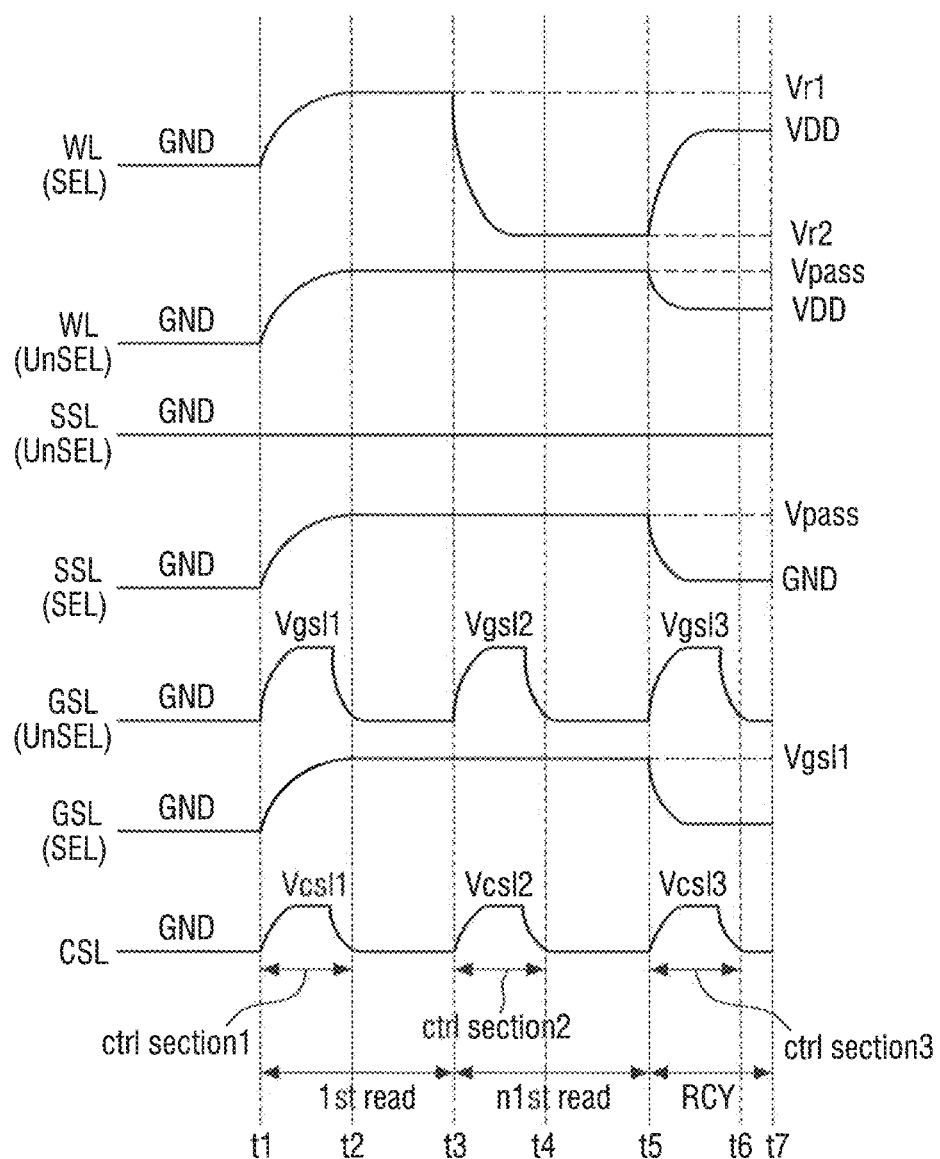
FIG. 8 is a timing diagram for explaining an operation method of the controller in another non-volatile memory device of FIG. 7 according to some embodiments of the present inventive concept.

With reference to FIG. 8 below, the operation of removing the boosting charges through the non-volatile memory device of FIG. 7 according to some embodiments of the present inventive concept will be described using a timing diagram.

FIG. 8 is a timing diagram for explaining an operation method of the controller in another non-volatile memory device of FIG. 7 according to some embodiments of the present inventive concept.

Referring to FIGS. 2, 7, and 8, voltages applied to a read operation target word line WL (SEL), a read operation target string select line SSL (SEL), a read operation target ground select line GSL (SEL), a non-read operation target word line WIL (UnSEL), a non-read operation target string select line SSL (UnSEL), a non-read operation target ground select line GSL (UnSEL), and a common source line CSL will be explained with reference to the timing diagram.

Hereinafter, it is assumed that each of the memory cells connected to a plurality of word lines WL0 to WLm is a multi-level cell (MLC) that stores 2 bits. In other words, the following explanation is also applicable to a single level cell (SLC), a triple level cell (TLC), and a quad level cell (QLC).

Here, it is assumed that the read operation target word line WL (SEL) is a selected word line WLm-3, the non-read operation target word line WL (UnSEL) is non-selected word lines WLm to WLm-2, WLm-4, and WL0, the read operation target string select line SSL (SEL) is a selected string select line SSL1, and the non-read operation target string select line SSL (UnSEL) is non-selected string select lines SSL2, SSL3 and SSL4. Further, it is assumed that the read operation target ground select line GSL (SEL) is a first ground select line GSL1, and the non-read operation target ground select line GSL (UnSEL) is a second ground select line GSL2.

Since the explanation of the read operation target word line WL (SEL), the read operation target string select line SSL (SEL), the non-read operation target word line WL (UnSEL), and the non-read operation target string select line SSL (UnSEL) is the same as that described with reference to FIG. 6, an explanation thereof will not be provided. Further, since the explanation of the read operation target ground select line GSL (SEL) is the same as the explanation of the ground select line GSL in FIG. 6, an explanation thereof will not be provided.

The non-volatile memory device 100 according to some embodiments of the present inventive concept, for example, the controller 140 of the non-volatile memory device 100 according to some embodiments of the present inventive concept, applies the control pulse (e.g., a first ground select line voltage Vgsl1, a second ground select line voltage Vgsl2 and a third ground select line voltage Vgsl3) to the second ground select line GSL2 through the control pulse generator 141 at each of a first control section (ctrl section1), a second control section (ctrl section2), and a third control section (ctrl section3) to perform the read operation on the memory cell MCm-3 of the string ST1. The first ground select line voltage Vgsl1, the second ground select line voltage Vgsl2, and the third ground select line voltage Vgsl3 may have, for example, a voltage of 2.5 V or more. The first ground select line voltage Vgsl1, the second ground select line voltage Vgsl2, and the third ground select line voltage Vgsl3 may have voltages different from each other. Thus, it is possible to prevent hot carriers from being generated in the non-volatile memory device 100, and remove the boosting charge.

The non-volatile memory device 100, for example, the controller 140 of the non-volatile memory device 100, applies the control pulse (e.g., a first common source line voltage Vcsl1, a second common source line voltage Vcsl2 and a third common source line voltage Vcsl3) to the common source line CSL through the control pulse generator 141 at each of the first control section (ctrl section1), the second control section (ctrl section2), and the third control section (ctrl section3) to perform the read operation on the memory cell MCm-3 of the string ST1. The first common source line voltage Vesl1, the second common source line voltage Vcsl2, and the third common source line voltage Vcsl3 may have, for example, a voltage of 0 V or more and less than 2 V. The first common source line voltage Vcsl1, the second common source line voltage Vcsl2, and the third common source line voltage Vcsl3 may have different voltages from each other. Thus, it is possible to prevent hot carriers from being generated in the non-volatile memory device 100, and remove the boosting charge.

The first control section (ctrl section1), at which the control pulse (for example, the first ground select line voltage Vgsl1 and the first common source line voltage Vcsl1) is applied, is applied at the first time point t1 at which the first read voltage Vr1 is applied to the selected word line WLm-3. The first time point t1, may be, for example, a time point at which the first read voltage Vr1 is applied to the selected word line WLm-3, to perform the read operation on LSB data when the read operation target memory cell is TLC. In another example, the first time point t1 may be a time point at which the first read voltage Vr1 is applied to the selected word line WLm-3 to perform the read operation of LSB data when the read operation target memory cell is QLC. A length of the first control section (ctrl section1) may be shorter or longer than the length shown in FIG. 8 as long as it is smaller than or equal to the length of the first read section (1st read).

The second control section (ctrl section2), at which the control pulse (for example, the second ground select line voltage Vgsl2 and the second common source line voltage Vcsl2) is applied, is applied at the third time point t3 at which the second read voltage Vr2 is applied to the selected word line WLm-3. The third time point t3, may be, for example, a time point at which the second read voltage Vr2 is applied to the selected word line WLm-3, to perform the read operation on LSB data when the read operation target memory cell is TLC. A length of the second control section (ctrl section2) may be shorter or longer than the length shown in FIG. 8 as long as it is smaller than or equal to the length of the second read section (n1st read).

A third control section (ctrl section3), at which a control pulse (e.g., a third ground select line voltage Vgsl3 and a third common source line voltage Vcsl3) is applied, is applied at a fifth time point t5 at which the recovery voltage VDD is applied to the plurality of word lines WLs to perform the recovery operation. A length of the third control section (ctrl section3) may be shorter or longer than the length shown in FIG. 8 as long as it is smaller than or equal to the length of the recovery section RCY.

The lengths of each of the first control section (ctrl section1), the second control section (ctrl section2), and the third control section (ctrl section3) may be different from each other.

Figure 9:
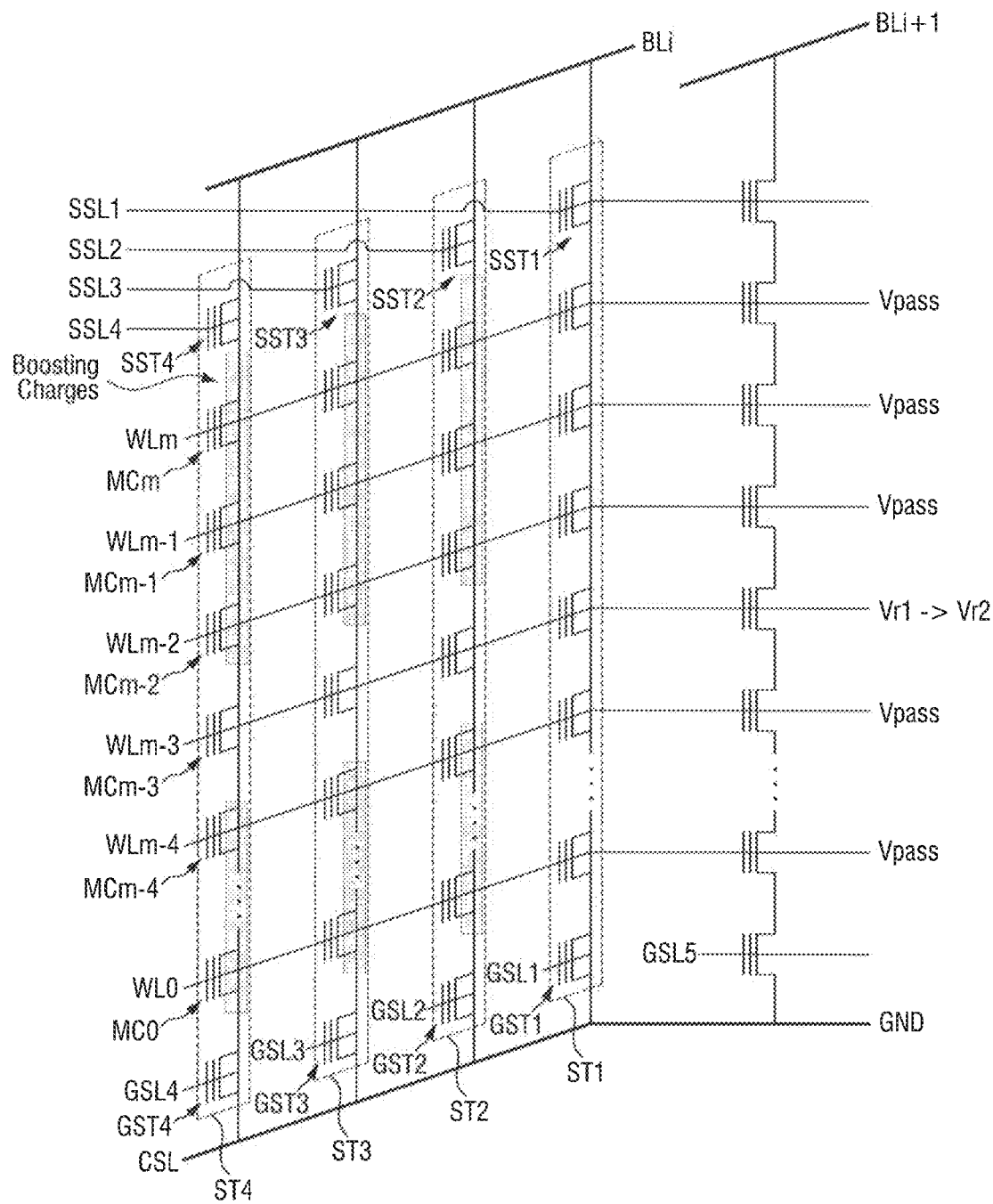
FIG. 9 is a circuit diagram for explaining the read operation of another non-volatile memory device according to some embodiments of the present inventive concept.

FIG. 9 is a circuit diagram for explaining the read operation of another non-volatile memory device according to some embodiments of the present inventive concept.

Referring to FIG. 9, unlike the non-volatile memory device of FIG. 4, a string ST1 selected for the read operation is connected through the first ground select line GSL1. In addition, the non-selected strings ST2, ST3, and ST4 in which no read operation is performed are connected through the second ground select line GSL2, the third ground select line GSL3, and the fourth ground select line GSL4. A fifth ground select line GSL5 is connected to a string connected to bit line BLi+1.

The operation of removing the boosting charges through the non-volatile memory device of FIG. 9 according to some embodiments of the present inventive concept will be explained with reference to FIG. 10 below.

Figure 10:
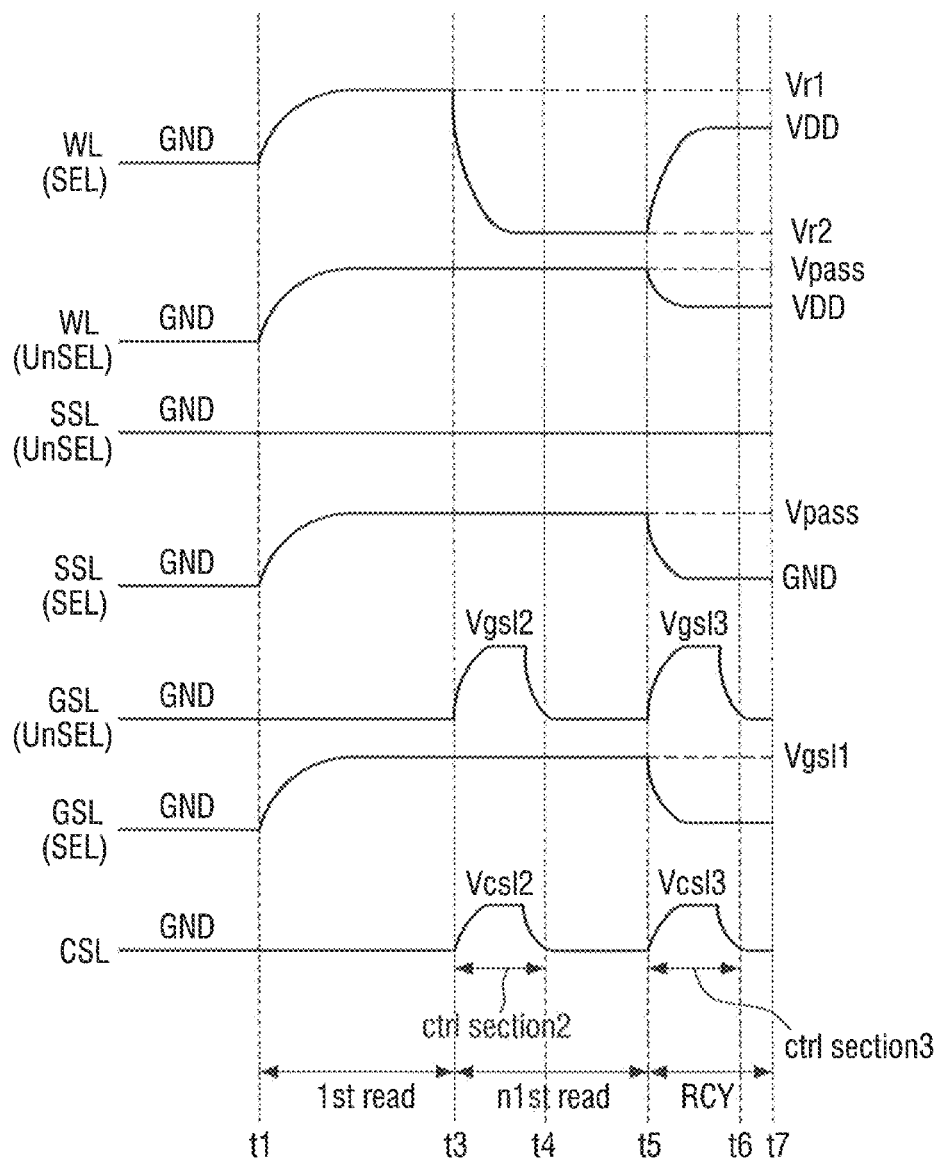
FIG. 10 is a timing diagram for explaining an operation method of the controller in another non-volatile memory device of FIG. 9 according to some embodiments of the present inventive concept.

FIG. 10 is a timing diagram for explaining an operation method of the controller in another non-volatile memory device of FIG. 9 according to some embodiments of the present inventive concept.

Referring to FIGS. 2, 9, and 10, voltages applied to a read operation target word line WL (SEL), a read operation target string select line SSL (SEL), a read operation target ground select line GSL (SEL), a non-read operation target word line WL (UnSEL), a non-read operation target string select line SSL (UnSEL), a non-read operation target ground select line GSL (UnSEL), and a common source line CSL will be explained with reference to the timing diagram.

Hereinafter, it is assumed that each of the memory cells connected to a plurality of word lines WL0 to WLm is a multi-level cell (MLC) that stores 2 bits. In other words, the following description is also applicable to a single level cell (SSLC), a triple level cell (TLC), and a quad level cell (QLC).

Here, it is assumed that the read operation target word line WL (SEL) is a selected word line WLm-3, the non-read operation target word line WL (UnSEL) is non-selected word lines WLm to WLm-2, WLm-4, and WL0, the read operation target string select line SSL (SEL) is a selected string select line SSL1, and the non-read operation target string select line SSL (UnSEL) is non-selected string select lines SSL2, SSL3 and SSLA. Further, it is assumed that the read operation target ground select line GSL (SEL) is a first ground select line GSL1, and the non-read operation target ground select line GSL (UnSEL) is non-selected ground select lines GSL2, GSL3, and GSL4.

The operation method of the controller in the non-volatile memory device of FIG. 9 in FIG. 10 is similar to the operation method in FIG. 8, except that since there is no first control section (ctrl section1). For example, unlike that shown in FIG. 8, the non-selected ground select lines GSL2, GSL3, and GSLA maintain the ground state during the first read section (tst read), and the common source line CSL maintains the ground state during the first read section (1st read). Thus, a repeated explanation will not be provided.

The non-volatile memory device and its operation method according to some of the above-described embodiments are explained for a case where no pre-pulse and/or post-pulse is applied to the non-selected string select line. Accordingly, the application of a control pulse to the ground select line and/or common source line, which is an example of a pre-pulse and/or a post-pulse being applied to the non-selected string select line, will be explained with reference to FIGS. 11 to 20. Since some of the explanation of FIGS. 11 to 20 is similar to the aforementioned explanation of FIGS. 1 to 10, except that a pre-pulse and/or a post-pulse is applied to the non-selected string select line, repeated explanations may not be provided.

Figure 11:
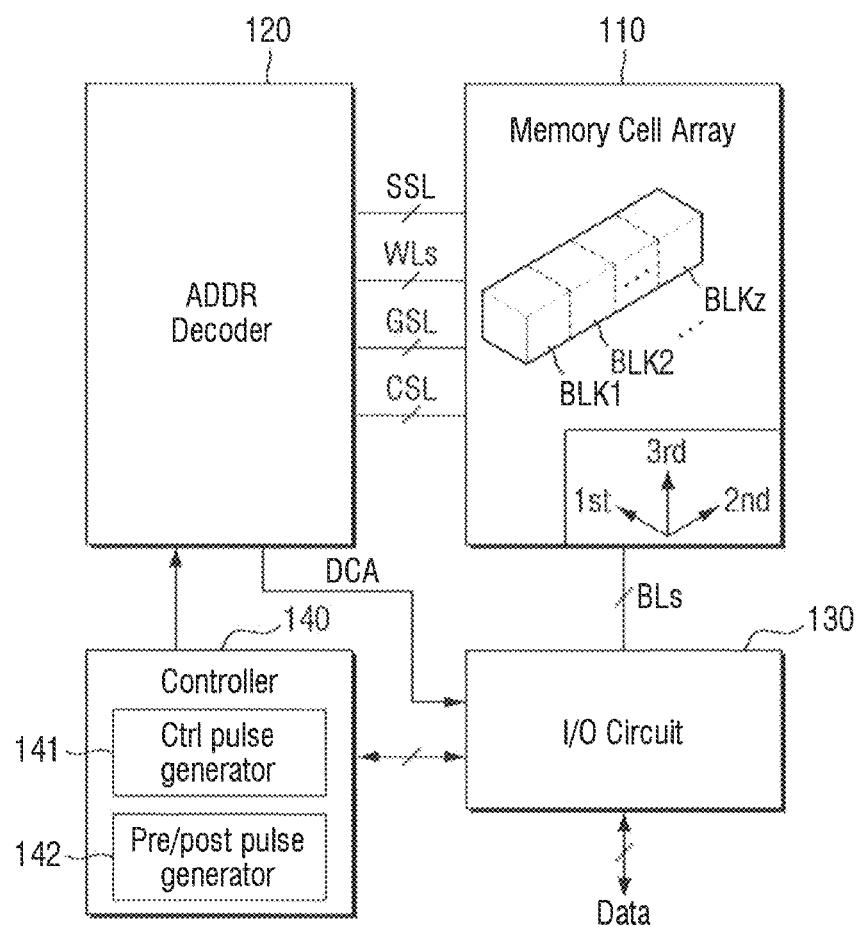
FIG. 11 is a block diagram showing another non-volatile memory device according to some embodiments of the present inventive concept.

FIG. 11 is a block diagram showing another non-volatile memory device according to some embodiments of the present inventive concept.

Referring to FIG. 11, unlike the non-volatile memory device 100 of FIG. 2, a controller 140 of another non-volatile memory device 100-2 according to some embodiments of the present inventive concept further includes a pre/post pulse generator 142.

In the pre/post pulse generator 142, a read disturbance may occur at the time of a read or verification operation due to the boosting charges generated by a hot carrier injection that occurs in the non-selected string when the non-volatile memory device 100-2 performs the read or verification operation. Therefore, the pre/post pulse generator 142 may apply a pre/post pulse to at least one non-selected string select line at a predetermined level for a predetermined time to remove the boosting charges of the non-selected string when the non-volatile memory device 100-2 performs the read or verification operation. In other words, the removal operation of the boosting charges in the bit line direction may be performed by application of the pre/post pulse.

The operation of removing the boosting charges through the non-volatile memory device 100-2 according to some embodiments of the present inventive concept will be explained with reference to FIGS. 12 to 20 below.

FIGS. 12 to 20 are timing diagrams for explaining an operation method of the controller in another non-volatile memory device of FIG. 11 according to some embodiments of the present inventive concept.

Figure 12:
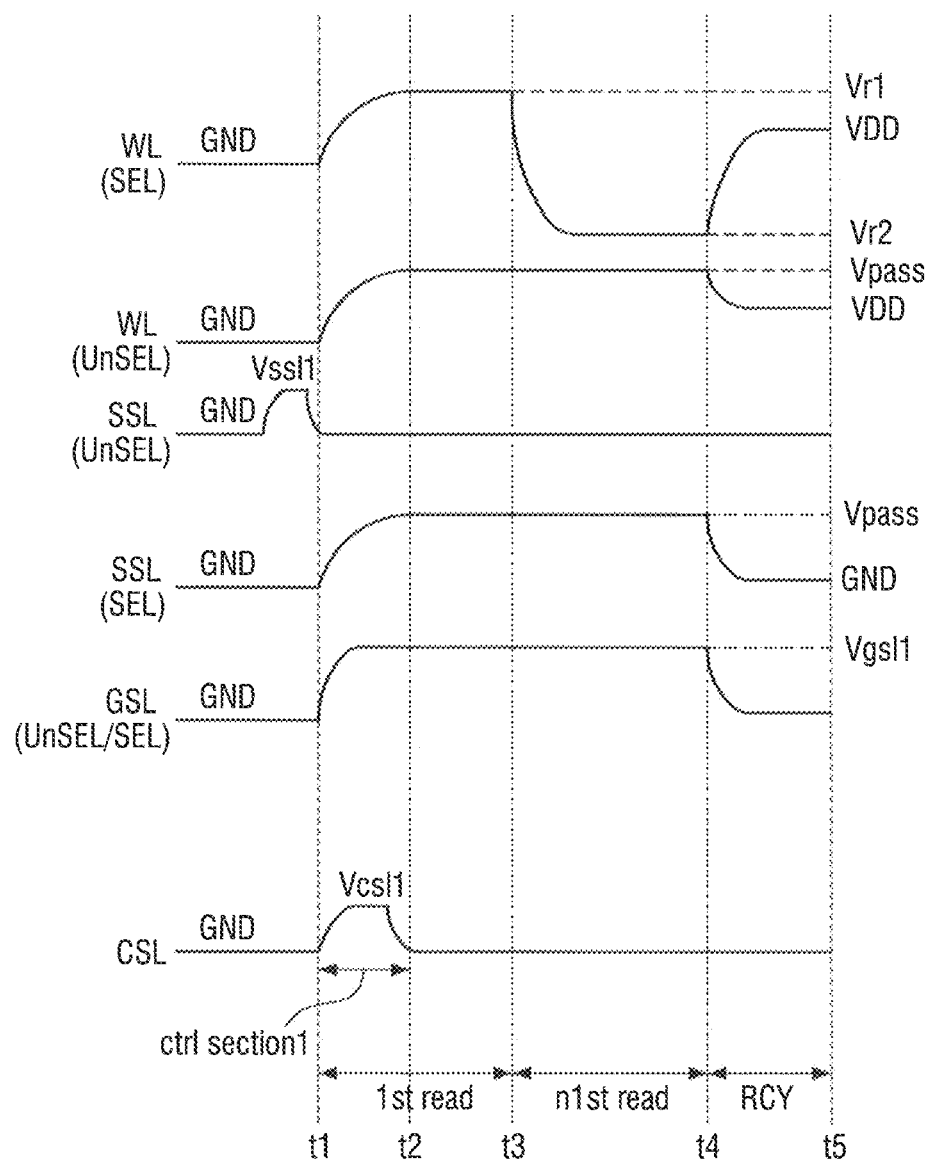
FIGS. 12, 13, 14, 15, 16, 17, 18, 19 and 20 are exemplary timing diagrams for explaining an operation method of the controller in another non-volatile memory device of FIG. 11 according to some embodiments of the present inventive concept.
Figure 13:
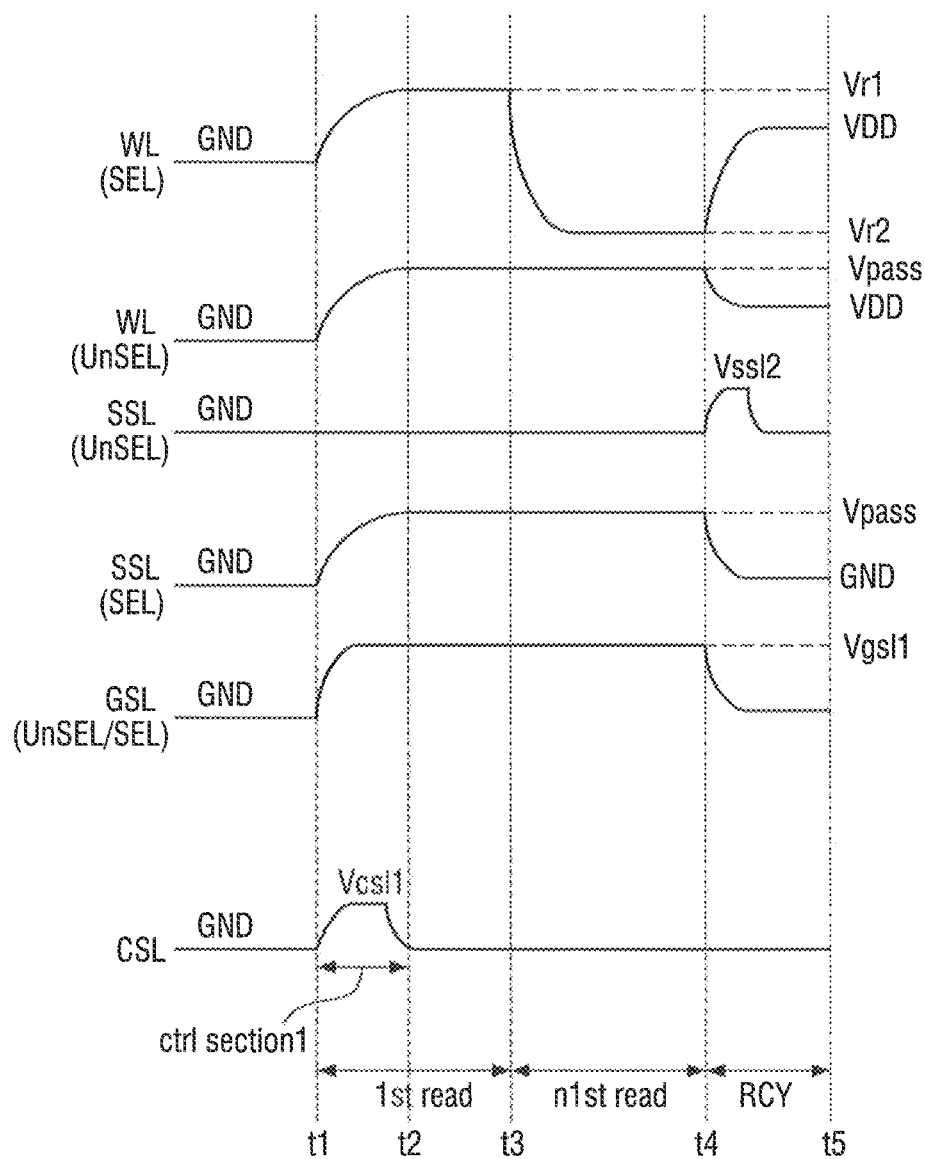
Figure 14:
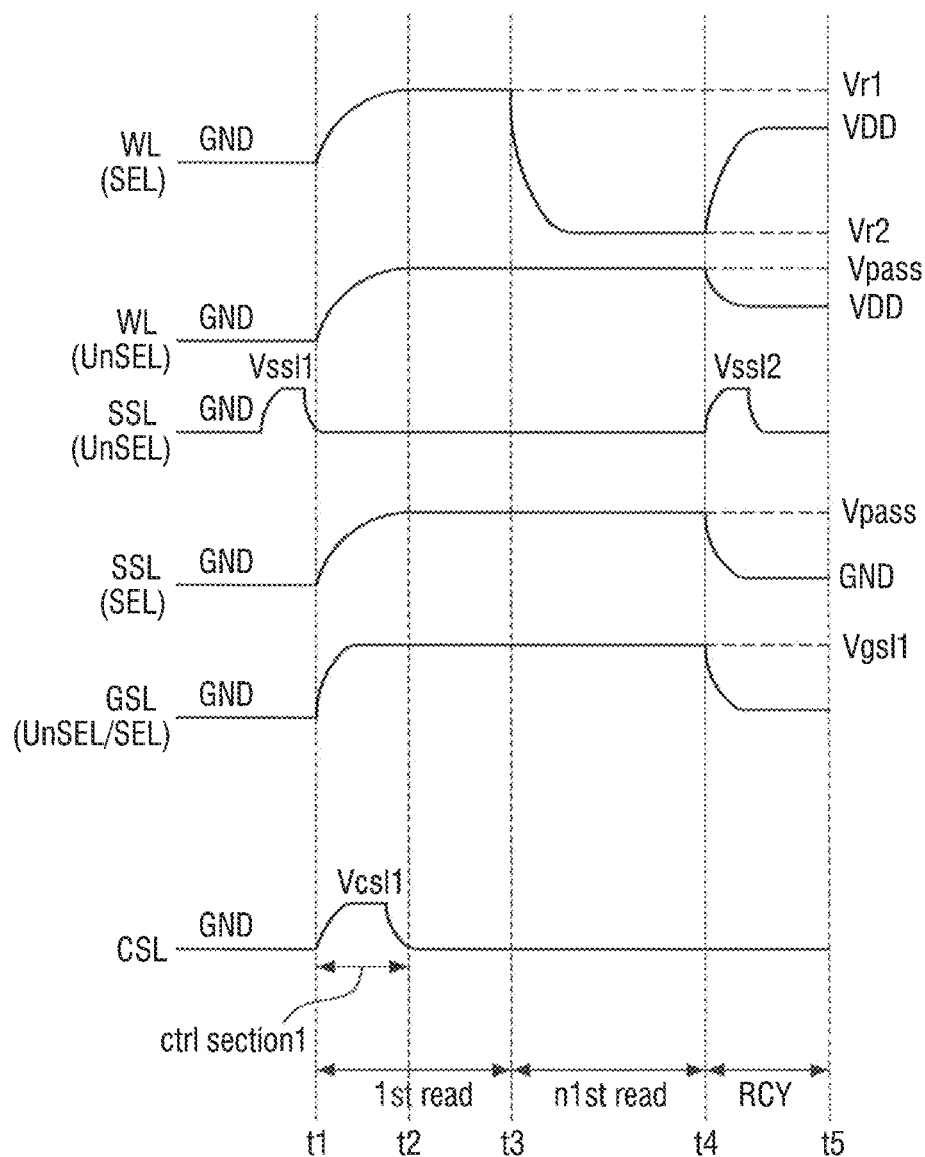

For reference, FIGS. 12 to 14 are timing diagrams showing an operation of the circuit diagram according to the embodiment of FIG. 4.

In other words, referring to FIGS. 4, 11 and 12, in addition to the timing diagram of FIG. 6, the controller 140 of the non-volatile memory device 100-2, for example, the pre/post pulse generator 142 applies a pre-pulse (e.g., the first string select voltage Vssl1) to the non-selected string select lines SSL2, SSL3 and SSL4 before the first time point t1 at which the first read section (1st read) starts. The level and operating section of the pre-pulse (e.g., the first string select voltage Vssl1) are not limited thereto. For example, the pre-pulse may just be applied before the first time point t1.

Further, referring to FIGS. 4, 11 and 13, in addition to the timing diagram of FIG. 6, the controller 140 of the non-volatile memory device 100-2, for example, the pre/post pulse generator 142 applies a post-pulse (e.g., the second string select voltage Vssl2) to the non-selected string select lines SSL2, SSL3 and SSL4 after the fourth time point t4 at which a recovery section RCY starts. The level and operating section of the post-pulse (e.g., the second string select voltage Vssl2) are not limited thereto. For example, the post-pulse may just be applied at the fourth time point t4.

In addition, referring to FIGS. 4, 11 and 14, in addition to the timing diagram of FIG. 6, the controller 140 of the non-volatile memory device 100-2, for example, the pre/post pulse generator 142 applies a pre-pulse (e.g., the first string select voltage Vssl1) to the non-selected string select lines SSL2, SSL3 and SSL4 before the first time point t1 at which the first read section (1st read) starts. Further, in addition to the timing diagram of FIG. 6, the controller 140 of the non-volatile memory device 100-2, for example, the pre/post pulse generator 142 applies a post-pulse (e.g., the second string select voltage Vssl2) to the non-selected string select lines SSL2, SSL3 and SSL4 after the fourth time point t4 at which the recovery section RCY starts. The level and operating section of the pre-pulse (e.g., the first string select voltage Vssl1) are not limited thereto. For example, the pre-pulse may just be applied before the first time point t1. In addition, the level and operating section of the post-pulse (e.g., the second string select voltage Vssl2) are not limited thereto. For example, the post-pulse may just be applied at the fourth time point t4.

Figure 15:
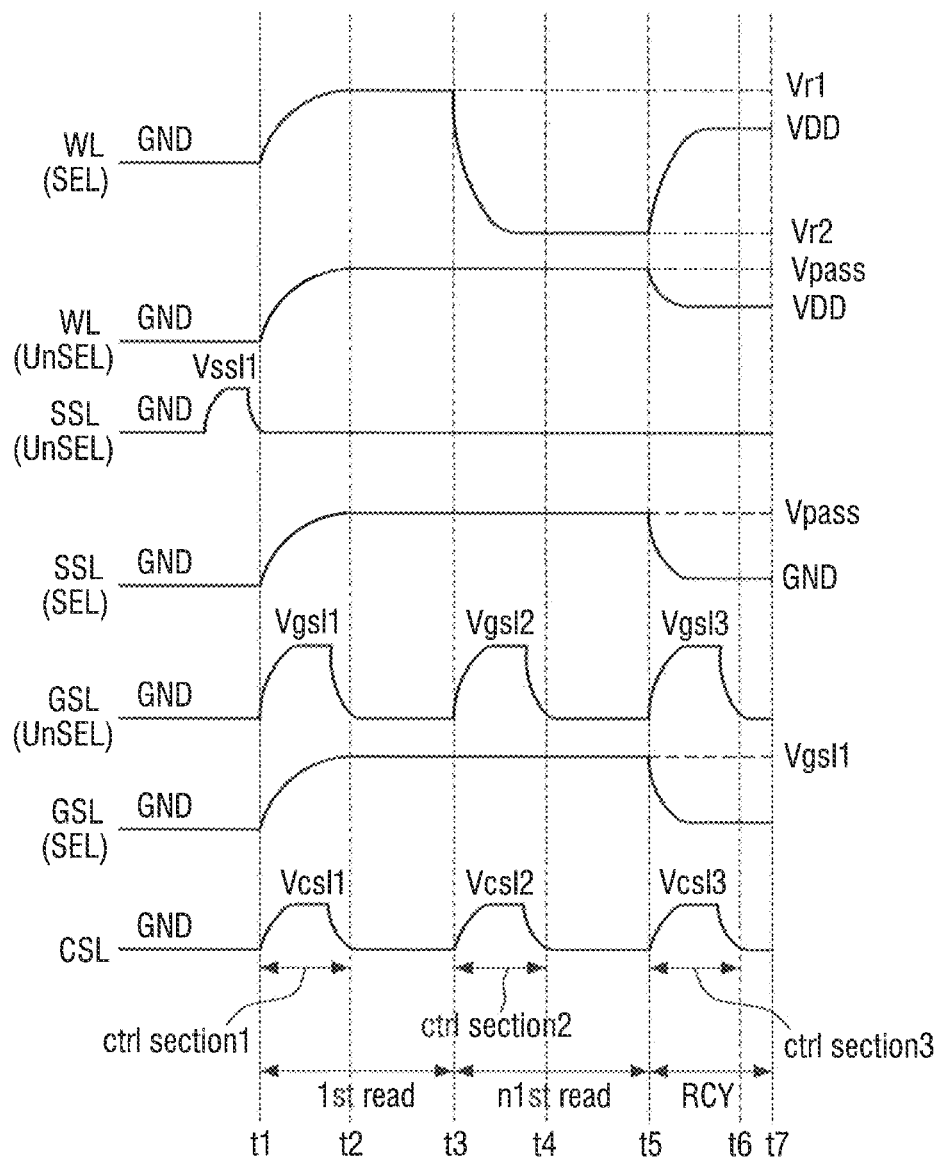
Figure 16:
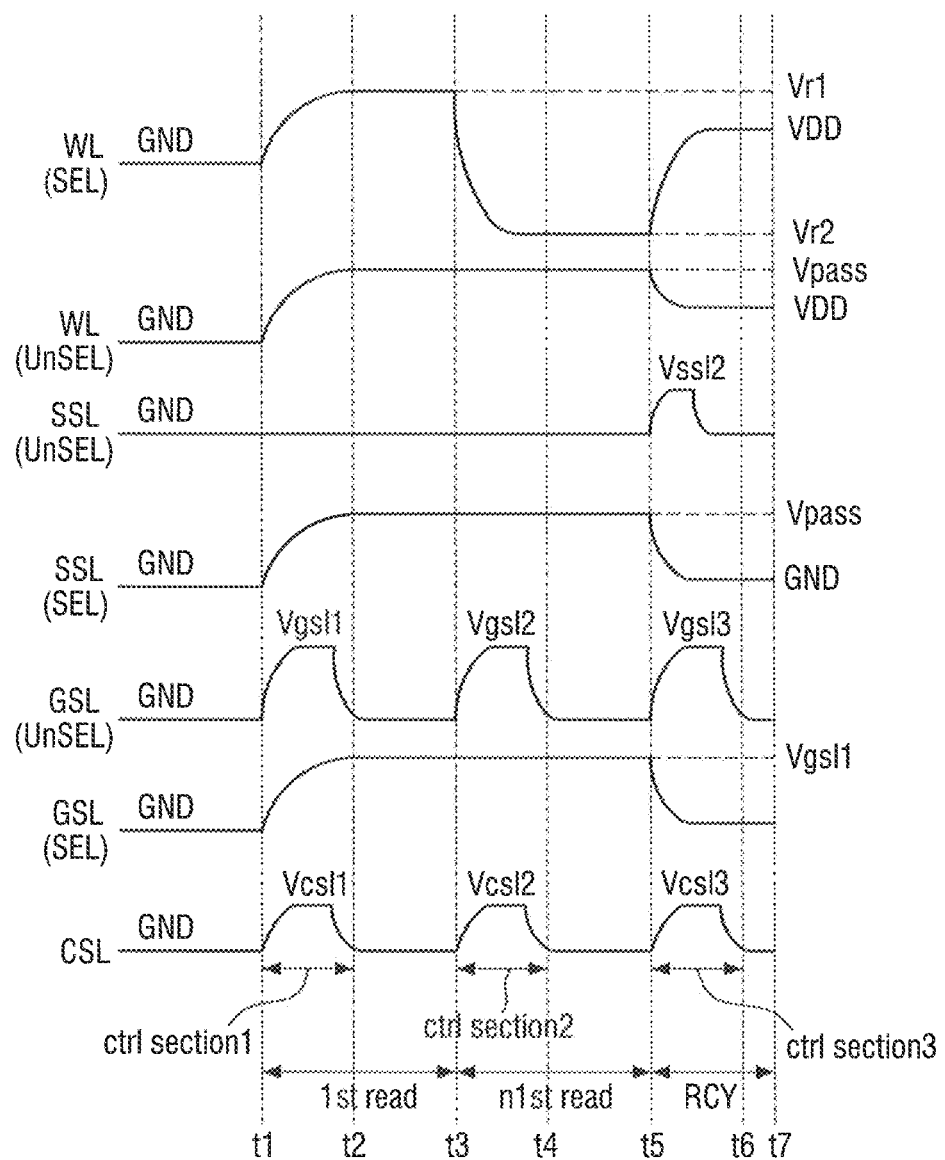
Figure 17:
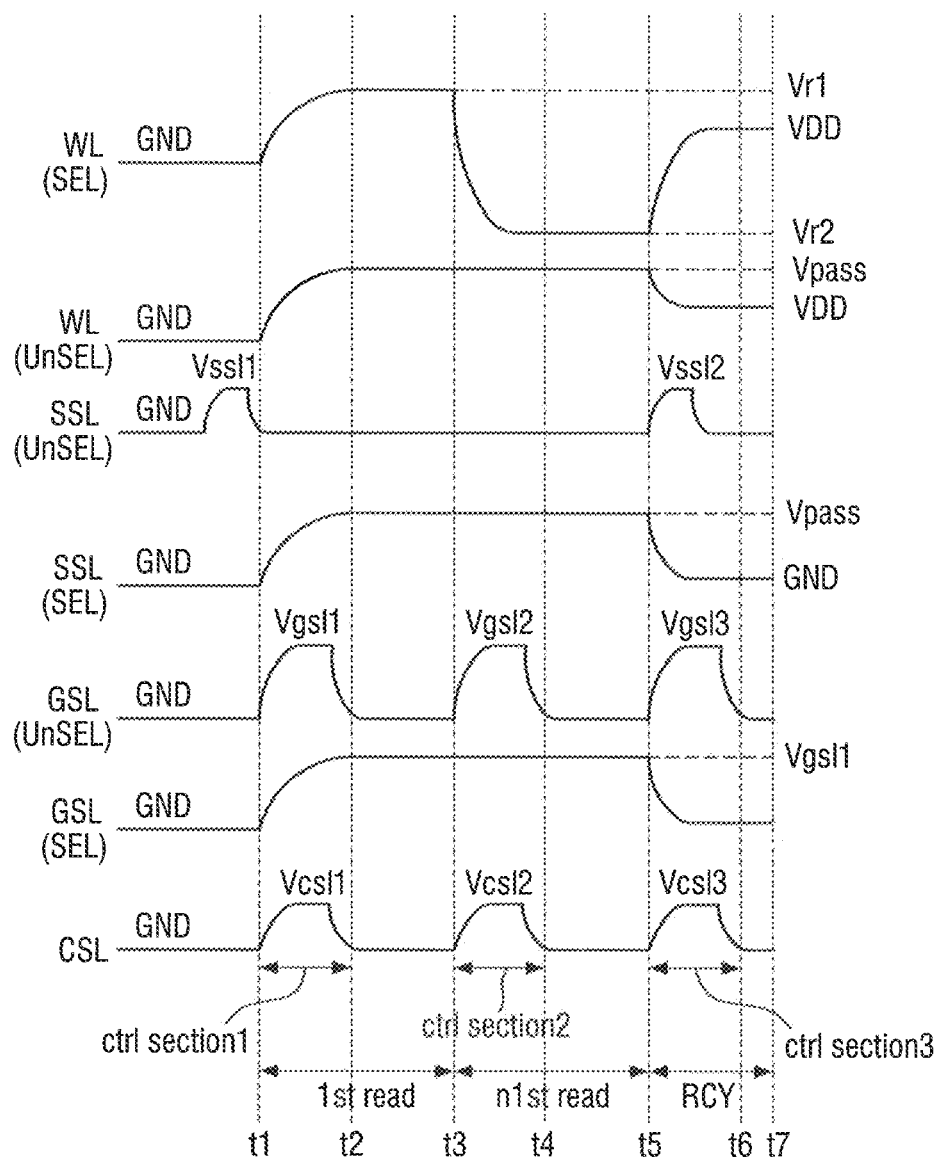

For reference, FIGS. 15 to 17 are timing diagrams showing an operation of the circuit diagram according to some embodiments of FIG. 7.

In other words, referring to FIGS. 7, 11 and 15, in addition to the timing diagram of FIG. 8, the controller 140 of the non-volatile memory device 100-2, for example, the pre/post pulse generator 142 applies a pre-pulse (e.g., the first string select voltage Vssl1) to the non-selected string select lines SSL2, SSL3 and SSL4 before the first time point t1 at which the first read section (1st read) starts. The level and operating section of the pre-pulse (e.g., the first string select voltage Vssl1) are not limited thereto. For example, the pre-pulse may just be applied before the first time point t1.

In addition, referring to FIGS. 7, 11 and 16, in addition to the timing diagram of FIG. 8, the controller 140 of the non-volatile memory device 100-2, for example, the pre/post pulse generator 142 applies a post-pulse (e.g., the second string select voltage Vssl2) to the non-selected string select lines SSL2, SSL3 and SSL4 after the fifth time point t5 at which the recovery section RCY starts. The level and operating section of the post-pulse (e.g., the second string select voltage Vssl2) are not limited thereto. For example, the post-pulse may just be applied at the fifth time point t5.

In addition, referring to FIGS. 7, 11 and 17, in addition to the timing diagram of FIG. 8, the controller 140 of the non-volatile memory device 100-2, for example, the pre/post pulse generator 142 applies a pre-pulse (e.g., the first string select voltage Vssl1) to the non-selected string select lines SSL2, SSL3 and SSL4 before the first time point t1 at which the first read section (1st read) starts. In addition, in addition to the timing diagram of FIG. 8, the controller 140 of the non-volatile memory device 100-2, for example, the pre/post pulse generator 142 applies a post-pulse (e.g., the second string select voltage Vssl2) to the non-selected string select lines SSL2, SSL3 and SSL4 after the fifth time point t5 at which the recovery section RCY starts. The level and operating section of the pre-pulse (e.g., the first string select voltage Vssl1) are not limited thereto. For example, the pre-pulse may just be applied before the first time point t1. In addition, the level and operating section of the post-pulse (e.g., the second string select voltage Vssl2) are not limited thereto. For example, the post-pulse may just be applied at the fifth time point 5.

Figure 18:
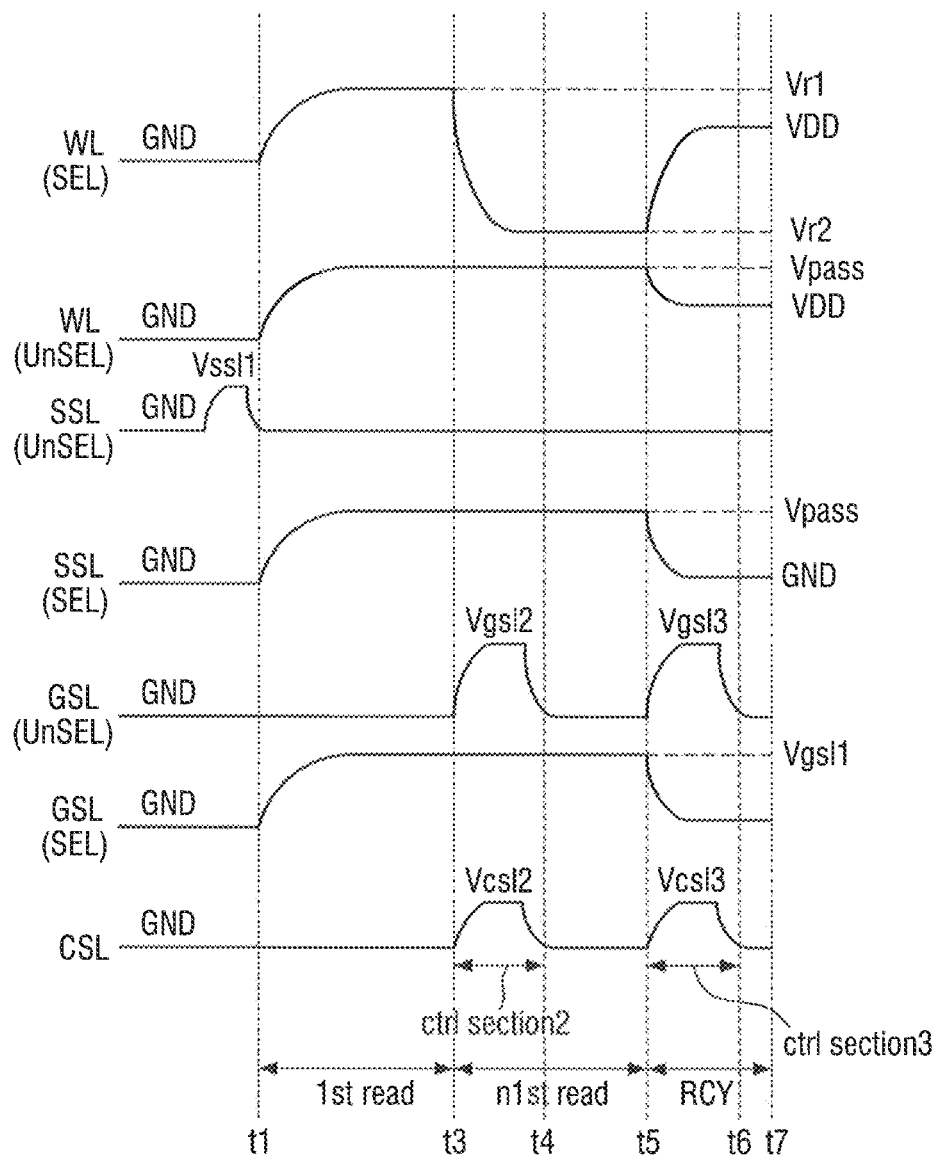
Figure 19:
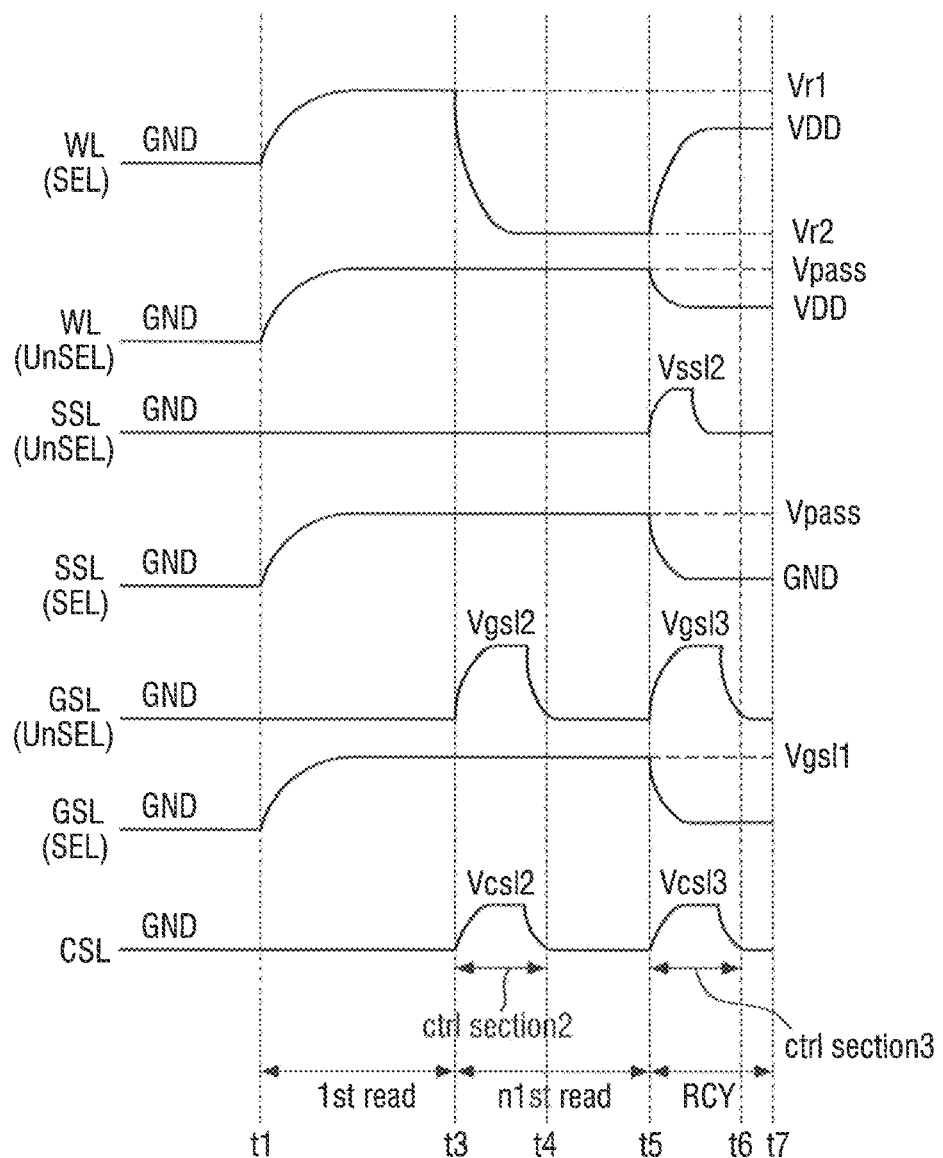
Figure 20:
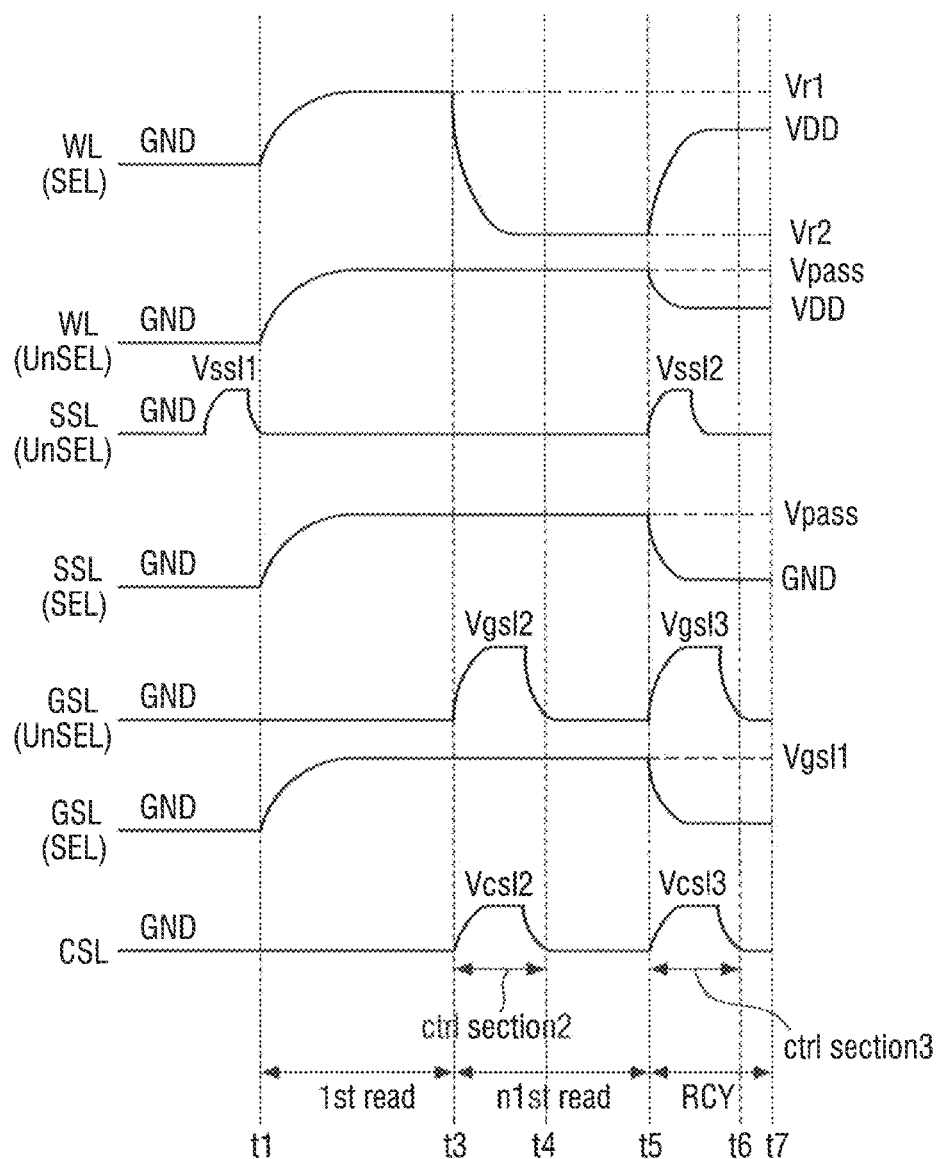

For reference, FIGS. 18 to 20 are timing diagrams showing an operation of the circuit diagram according to some embodiments of FIG. 9.

In other words, referring to FIGS. 9, 11 and 18, in addition to the timing diagram of FIG. 8, the controller 140 of the non-volatile memory device 100-2, for example, the pre/post pulse generator 142 applies a pre-pulse (e.g., the first string select voltage Vssl1) to the non-selected string select lines SSL2, SSL3 and SSLA before the first time point t1 at which the first read section (1st read) starts. The level and operating section of the pre-pulse (e.g., the first string select voltage Vssl1) are not limited thereto. For example, it is sufficient that just the pre-pulse is applied before the first time point t1.

In addition, referring to FIGS. 9, 11 and 19, in addition to the timing diagram of FIG. 9, the controller 140 of the non-volatile memory device 100-2, for example, the pre/post pulse generator 142 applies a post-pulse (e.g., the second string select voltage Vssl2) to the non-selected string select lines SSL2, SSL3 and SSL4 after the fifth time point t5 at which the recovery section RCY starts. The level and operating section of the post-pulse (e.g., the second string select voltage Vssl2) are not limited thereto. For example, it is sufficient that just the post-pulse is applied at the fifth time point t5.

In addition, referring to FIGS. 9, 11 and 20, in addition to the timing diagram of FIG. 9, the controller 140 of the non-volatile memory device 100-2, for example, the pre/post pulse generator 142 applies a pre-pulse (e.g., the first string select voltage Vssl1) to the non-selected string select lines SSL2, SSL3 and SSL4 before the first time point t1 at which the first read section (1st read) starts. In addition, in addition to the timing diagram of FIG. 9, the controller 140 of the non-volatile memory device 100-2, for example, the pre/post pulse generator 142 applies a post-pulse (e.g., the second string select voltage Vssl2) to the non-selected string select lines SSL2, SSL3 and SSL4 after the fifth time point t5 at which the recovery section RCY starts. The level and operating section of the pre-pulse (e.g., the first string select voltage Vssl1) are not limited thereto. For example, it is sufficient that just the pre-pulse is applied before the first time point t1. In addition, the level and operating section of the post-pulse (e.g., the second string select voltage Vssl2) are not limited thereto. For example, it is sufficient that just the post-pulse is applied at the fifth time point t5.

Figure 21:
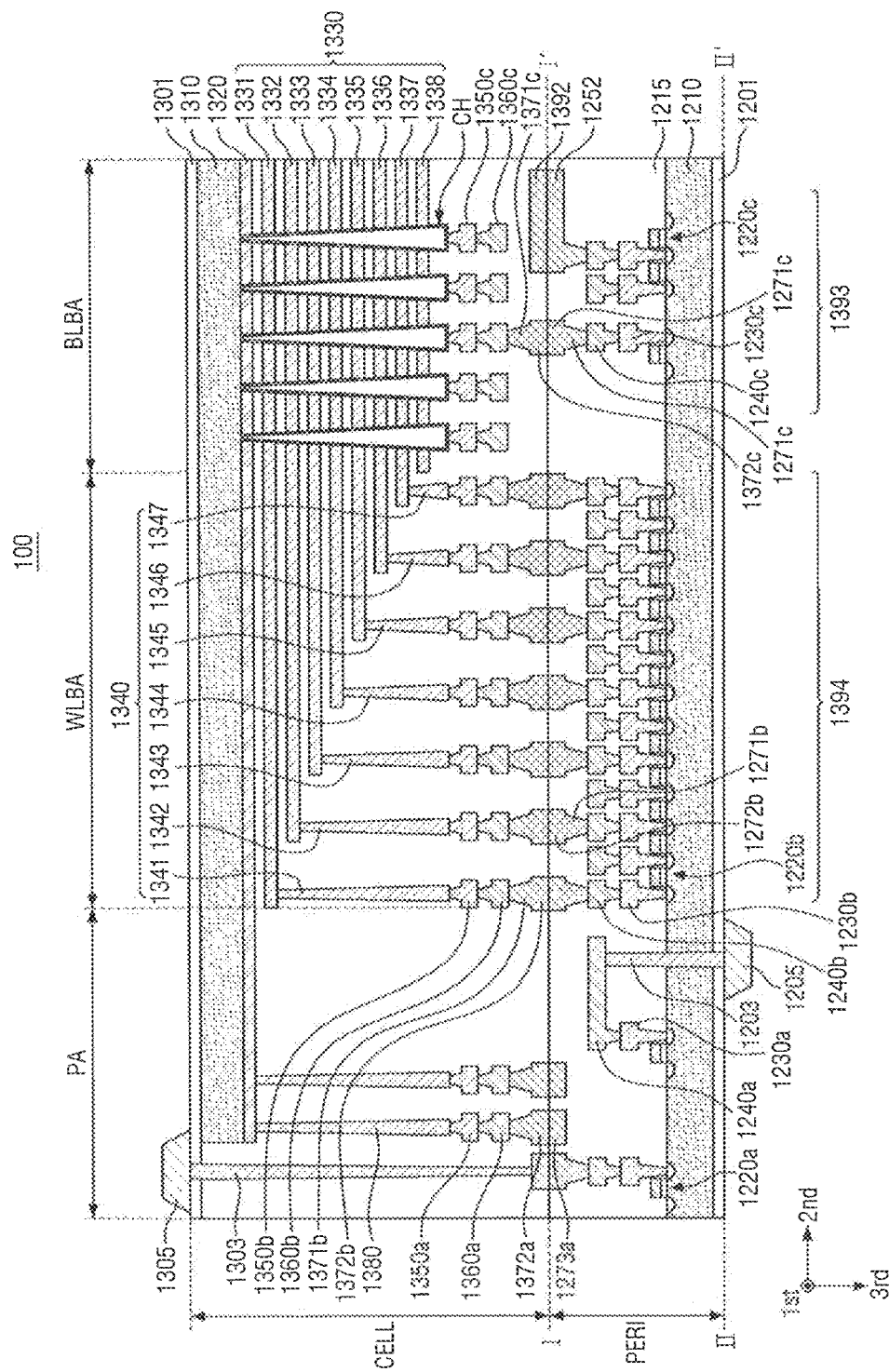
FIG. 21 is a cross-sectional view for explaining a structure of the non-volatile memory device according to some embodiments of the present inventive concept.

FIG. 21 is a cross-sectional view for explaining a structure of the non-volatile memory device according to some embodiments of the present inventive concept.

Referring to FIGS. 2, 11, and 21, the non-volatile memory device 100 or 100-2 according to some embodiments of the present inventive concept may have a chip-to-chip (C2C) structure. In FIG. 21, a cell region CELL of the non-volatile memory device 100 or 100-2 may correspond to the non-volatile memory cell array 110 of FIG. 2 and/or FIG. 11. The C2C structure may mean that an upper chip including the cell region CELL is manufactured on the first wafer, a lower chip including a peripheral circuit region PERI is manufactured on a second wafer different from the first wafer, and then, the upper chip and the lower chip are connected to each other by a bonding technique. As an example, the bonding technique may refer to a way of electrically connecting a bonding metal formed on the uppermost metal layer of the upper chip and a bonding metal formed on the uppermost metal layer of the lower chip to each other. For example, when the bonding metal is formed of copper (Cu), the bonding way may be a Cu—Cu bonding technique, and the bonding metal may also be formed of aluminum or tungsten.

Each of the peripheral circuit region PERI and the cell region CELL of the non-volatile memory device 100 or 100-2 may include an external pad bonding region PA, a word line bonding region WLBA, and a bit line bonding region BLBA.

The peripheral circuit region PERI may include a first substrate 1210, an interlayer insulating layer 1215, a plurality of circuit elements 1220a, 1220b and 1220c formed on the first substrate 1210, first metal layers 1230a, 1230b and 1230c connected to each of the plurality of circuit elements 1220a, 1220b and 1220c, and second metal layers 1240a, 1240b and 1240c formed on the first metal layers 1230a, 1230b and 1230c. In an embodiment of the present inventive concept, the first metal layers 1230a, 1230b and 1230c may be formed of tungsten, which has a relatively high resistance, and the second metal layers 1240a, 1240b and 1240c may be formed of copper, which has a relatively low resistance.

In the present specification, although only the first metal layers 1230a, 1230b, and 1230c and the second metal layers 1240a, 1240b and 1240c are shown and described, the present inventive concept is not limited thereto, and at least one or more metal layers may be further formed on the second metal layers 1240a, 1240b and 1240c. At least a part of one or more metal layers formed on the upper parts of the second metal layers 1240a, 1240b and 1240c may be formed of aluminum or the like, which has a resistance lower than that of copper forming the second metal layers 1240a, 1240b and 1240c.

The interlayer insulating layer 1215 is placed on the first substrate 1210 to cover a plurality of circuit elements 1220a, 1220b and 1220c, the first metal layers 1230a, 1230b and 1230c, and the second metal layers 1240a, 1240b and 1240c, and may include insulating materials such as silicon oxides and silicon nitrides.

Lower bonding metals 1271b and 1272b may be formed on the second metal layer 1240b of the word line bonding region WLBA. In the word line bonding region WLBA, the lower bonding metals 1271b and 1272b of the peripheral circuit region PERI may be electrically connected to upper bonding metals 1371b and 1372b of the cell region CELL by a bonding technique. The lower bonding metals 1271b and 1272b and the upper bonding metals 1371b and 1372b may be formed of aluminum, copper, tungsten, or the like.

The cell region CELL may include at least one block of memory (e.g., at least one of BLK1 to BLKz). The cell region CELL may include a second substrate 1310 and a common source line 1320 (corresponding to CSL of FIG. 4). A plurality of word lines (1331-1338; 1330, corresponding to WL1 to WL8 of WL0 to WLm of FIG. 4) may be stacked on the second substrate 1310, along a third direction (3rd) perpendicular to the upper surface of the second substrate 1310. String select lines and ground select lines may be each placed at the upper part and the lower part of the word lines 1330, and a plurality of word lines 1330 may be placed between the string select lines and the ground select lines.

In the bit line bonding region BLBA, a channel structure CH may extend in the third direction (3rd) perpendicular to the upper surface of the second substrate 1310 to penetrate the word lines 1330, the string select lines, and the ground select line. The channel structure CH may include a data storage layer, a channel layer, a buried insulating layer, etc., and the channel layer may be electrically connected to the first metal layer 1350c and the second metal layer 1360c. For example, the first metal layer 1350c may be a bit line contact, and the second metal layer 1360c may be a bit line (corresponding to BL1 to BL3 (e.g., BLi, BLi+1, etc.) of FIG. 4). In an embodiment of the present inventive concept, the bit line 1360c may extend along a second direction (2nd) parallel to the upper surface of the second substrate 1310.

In the embodiment shown in FIG. 21, the region in which the channel structure CH and the bit line 1360c are placed may be the bit line bonding region BLBA. The bit line 1360c may be electrically connected to the circuit elements 1220c that provide a page buffer 1393 in the peripheral circuit region PERI in the bit line bonding region BLBA. As an example, the bit line 1360c is connected to the upper bonding metals 1371c and 1372c in the peripheral circuit region PERI, and the upper bonding metals 1371c and 1372c may be connected to the lower bonding metals 1271c and 1272c connected to the circuit elements 1220c of the page buffer 1393.

In the word line bonding region WLBA, the word lines 1330 may extend along the second direction (2nd) parallel to the upper surface of the second substrate 1310, and may be connected to a plurality of cell contact plugs (1341 to 1347; 1340). The word lines 1330 and the cell contact plugs 1340 may be connected to each other with pads provided by extending at least part of the word lines 1330 along the second direction (2nd) with different lengths. A first metal layer 1350b and a second metal layer 1360b may be sequentially connected to the upper parts of the cell contact plugs 1340 connected to the word lines 1330. The cell contact plugs 1340 may be connected to the peripheral circuit region PERI through the upper bonding metals 1371b and 1372b of the cell region CELL and the lower bonding metals 1271b and 1272b of the peripheral circuit region PERI in the word line bonding region WLBA.

The cell contact plugs 1340 may be electrically connected to the circuit elements 1220b that provide a row decoder 1394 in the peripheral circuit region PERI. In an embodiment of the present inventive concept, the operating voltage of the circuit elements 1220b that provide the row decoder 1394 may differ from the operating voltage of the circuit elements 1220c that provide the page buffer 1393. As an example, the operating voltage of the circuit elements 1220c that provide the page buffer 1393 may be higher than the operating voltage of the circuit elements 1220b that provide the row decoder 1394.

A common source line contact plug 1380 may be placed in the external pad bonding region PA. The common source line contact plug 1380 is formed of a conductive material such as a metal, metal compound or polysilicon, and may be electrically connected to the common source line 1320. A first metal layer 1350a and a second metal layer 1360a may be stacked sequentially on the upper part of the common source line contact plug 1380. As an example, the region in which the common source line contact plug 1380, the first metal layer 1350a, and the second metal layer 1360a are placed may be referred to as an external pad bonding region PA.

I/O pads 1205 and 1305 may be placed in the external pad bonding region PA. Still, referring to FIG. 21, a lower insulating film 1201 that covers the lower surface of the first substrate 1210 may be formed on the lower part of the first substrate 1210, and the first I/O pad 1205 may be formed on the lower insulating film 1201. The first I/O pad 1205 is connected to at least one of a plurality of circuit elements 1220a, 1220b and 1220c placed in the peripheral circuit region PERI through a first I/O contact plug 1203, and may be separated from the first substrate 1210 by the lower insulating film 1201. Further, a side insulating film may be placed between the first I/O contact plug 1203 and the first substrate 1210 to electrically separate the first I/O contact plug 1203 and the first substrate 1210.

Referring still to FIG. 21, an upper insulating film 1301 that covers the upper surface of the second substrate 1310 may be formed on the upper part of the second substrate 1310, and the second I/O pad 1305 may be placed on the upper insulating film 1301. The second I/O pad 1305 may be connected to at least one of a plurality of circuit elements 1220a, 1220b and 1220c placed in the peripheral circuit region PERI through the second I/O contact plug 1303.

According to the embodiments of the present inventive concept, the second substrate 1310 and the common source line 1320 may not be placed in the region in which the second I/O contact plug 1303 is placed. In addition, the second I/O pad 1305 may not overlap the word lines 1380 in the third direction (3rd). The second I/O contact plug 1303 is separated from the second substrate 1310 in the second direction (2nd) parallel to the upper surface of the second substrate 1310, and may penetrate the interlayer insulating layer 1315 of the cell region CELL and be connected to the second I/O pad 1305.

According to the embodiments of the present inventive concept, the first VO pad 1205 and the second I/O pad 1305 may be selectively formed. As an example, the non-volatile memory device 100 according to some embodiments of the present inventive concept includes only a first I/O pad 1205 located on the first substrate 1201, or may include only a second I/O pad 1305 located on the second substrate 1301. Or, the memory device 100 may include both the first I/O pad 1205 and the second I/O pad 1305.

A metal pattern of the uppermost metal layer exists as a dummy pattern in each of the external pad bonding region PA and the bit line bonding region BLBA included in each of the cell region CELL and the peripheral circuit region PERI, or the uppermost metal layer may be omitted.

The non-volatile memory device 100 or 100-2 according to some embodiments of the present inventive concept may include a lower metal pattern 1273a having the same shape as an upper metal pattern 1372a of the cell region CELL on the uppermost metal layer of the peripheral circuit region PERI, to correspond to the upper metal pattern 1372a formed on the uppermost metal layer of the cell region CELL in an external pad bonding region PA. The lower metal pattern 1273a formed on the uppermost metal layer of the peripheral circuit region PERI may not be connected to another contact in the peripheral circuit region PERI. Similarly, an upper metal pattern having the same shape as the lower metal pattern of the peripheral circuit region PERI may be formed on the upper metal layer of the cell region CELL, to correspond to the lower metal pattern formed on the uppermost metal layer of the peripheral circuit region PERI in the external pad bonding region PA.

Lower bonding metals 1271b and 1272b may be formed on the second metal layer 1240b of the word line bonding region WLBA. In the word line bonding region WLBA, the lower bonding metals 1271b and 1272b of the peripheral circuit region PERI may be electrically connected to the upper bonding metals 1371b and 1372b of the cell region CELL by a bonding technique.

Further, an upper metal pattern 1392 having the same shape as a lower metal pattern 1252 of the peripheral circuit region PERI may be formed on the uppermost metal layer of the cell region CELL, to correspond to the lower metal pattern 1252 formed on the uppermost metal layer of the peripheral circuit region PERI in the bit line bonding region BLBA. A contact may not be formed on the upper metal pattern 1392 formed on the uppermost metal layer of the cell region CELL.

While the present inventive concept has been described with reference to exemplary embodiments thereof, it will be understood by those of ordinary skill in the art that various changes in form and details may be made thereto without departing from the spirit and scope of the present inventive concept as set forth by the following claims.

What is claimed is:

1. A non-volatile memory device, comprising:
a memory cell array which includes a first string including a first string select transistor, a first memory cell and a first ground select transistor stacked sequentially in a first direction, a second string including a second string select transistor, a second memory cell and a second ground select transistor stacked sequentially in the first direction, and a common source line, wherein a first word line is connected to the first memory cell, a first string select line is connected to the first string select transistor, a first ground select line is connected to the first ground select transistor, a second word line is connected to the second memory cell, a second string select line is connected to the second string select transistor, and a second ground select line is connected to the second ground select transistor; and
a controller configured to apply a pass voltage to the first string select line from a first time point,
apply a first read voltage to the first word line during a first read section from the first time point to a second time point,
apply a first ground select line voltage to the first ground select line from the first time point,
apply a ground voltage to the second string select line,
apply the first ground select line voltage to the second ground select line during a first control section which is a portion of the first read section, and
apply a first common source line voltage to the common source line during the first control section.

2. The non-volatile memory device of claim 1,
wherein the controller
applies a second ground select line voltage to the second ground select line during a recovery section, and
applies a second common source line voltage to the common source line during the recovery section.

3. The non-volatile memory device of claim 2, wherein the first ground select line voltage and the second ground select line voltage are different from each other.

4. The non-volatile memory device of claim 2, wherein the first common source line voltage and the second common source line voltage are different from each other.

5. The non-volatile memory device of claim 1, wherein the first ground select line voltage is greater than the first common source line voltage.

6. The non-volatile memory device of claim 1, wherein the controller applies a first string line puke to the second string select line before the first time point.

7. The non-volatile memory device of claim 6,
wherein the controller
applies the pass voltage to the first string select line up to a third time point, and
applies a second string line pulse to the second string select line after the third time point.

8. The non-volatile memory device of claim 1, wherein the first ground select line voltage is 2.5 V or more.

9. The non-volatile memory device of claim 1, wherein the first comma source line voltage is equal to or greater than 0 V and smaller than 2 V.

10. A non-volatile memory system, comprising:
a host; and
a non-volatile memory device which receives a read command from the hast,
wherein the non-volatile memory device includes
a memory cell array which includes a first string including a first string select transistor, a first memory cell and a first ground select transistor, a second string including a second memory cell corresponding to a read address of the read command, and a common source line; and
a controller which applies a first read voltage to the second memory cell during a first read section, applies a first ground select line voltage to the first ground select transistor during a first control section, which is a part of the first read section, and applies a first common source line voltage to the common source line during the first control section.

11. The non-volatile memory system of claim 10,
wherein the controller
applies a second ground select line voltage to the first ground select transistor during a recovery section, and
applies a second common source line voltage to the common source line during the recovery section.

12. The non-volatile memory system of claim 11, wherein the first ground select line voltage and the second ground select line voltage are different from each other.

13. The non-volatile memory system of claim 11, wherein the first common source line voltage and the second common source line voltage are different from each other.

14. The non-volatile memory system of claim 10, wherein the first ground select line voltage is greater than the first common source line voltage.

15. The non-volatile memory system of claim 10, wherein the controller applies a first string line pulse to the first string select transistor before the first time point.

16. The non-volatile memory system of claim 15,
wherein the controller
applies a pass voltage to the first memory cell from the first time point to a third time point, and
applies a second string line pulse to the first string select transistor after the third time point.

17. The non-volatile memory system of claim 10, wherein the first ground select line voltage is 2.5 V or more.

18. The non-volatile memory system of claim 10, wherein the first common source line voltage is equal to or greater than 0 V and smaller than 2V.

19. A non-volatile memory device, comprising:
a memory cell array which includes a first string including a first string select transistor, a first memory cell and a first ground select transistor, a second string including a second string select transistor, a second memory cell and a second ground select transistor, and a common source line connected to the first string and the second string;
an address decoder connected to the first memory cell through a first word line, connected to the first string select transistor through a first string select line, connected to the first ground select transistor through a first ground select line, connected to the second memory cell through a second word line, connected to the second string select transistor through a second string select line, connected to the second ground select transistor through a second ground select line, and connected to the common source line;

an input/output circuit which receives a decoded column address from the address decoder; and a controller which applies a pass voltage to the first string select line from a first time point, applies a first read voltage to the first word line during a first read section from the first time point to a second time point, applies a first ground select line voltage to the first ground select line from the first time point, applies a ground voltage to the second string select line, applies a first ground select line voltage to the second ground select line during a first control section, which is a portion of the first read section, and applies a first common source line voltage to the common source line during the first control section.

20. The non-volatile memory device of claim 19, wherein the controller applies a second ground select line voltage to the second ground select line during a recovery section, and applies a second common source line voltage to the common source line during the recovery section.

* * * * *